United States Patent
Song et al.

(10) Patent No.: US 11,037,620 B1
(45) Date of Patent: Jun. 15, 2021

(54) MEMORY DEVICE HAVING FAULT DETECTION FUNCTIONALITY AND CONTROL SYSTEM INCLUDING THE SAME

(71) Applicant: Samsung Electronics Co., Ltd., Suwon-si (KR)

(72) Inventors: Junghak Song, Suwon-si (KR); Chanho Lee, Taean-gun (KR); Juchang Lee, Suwon-si (KR); Taemin Choi, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/916,280

(22) Filed: Jun. 30, 2020

(30) Foreign Application Priority Data

Dec. 6, 2019 (KR) .................. 10-2019-0161671

(51) Int. Cl.
| | | |
|---|---|---|
| *G11C 11/40* | (2006.01) | |
| *G11C 11/408* | (2006.01) | |
| *G11C 29/44* | (2006.01) | |
| *G11C 11/4094* | (2006.01) | |

(52) U.S. Cl.
CPC ...... *G11C 11/4087* (2013.01); *G11C 11/4085* (2013.01); *G11C 11/4094* (2013.01); *G11C 29/44* (2013.01)

(58) Field of Classification Search
CPC ............ G11C 11/4087; G11C 11/4085; G11C 11/4094; G11C 29/44
See application file for complete search history.

(56) References Cited

U.S. PATENT DOCUMENTS

| | | | | |
|---|---|---|---|---|
| 5,097,445 A | * | 3/1992 | Yamauchi | G06F 12/1425 365/185.04 |
| 6,751,700 B2 | * | 6/2004 | Donoghue | G06F 12/0835 711/128 |
| 6,954,827 B2 | * | 10/2005 | Park | G06F 12/0893 365/49.1 |
| 8,379,468 B2 | | 2/2013 | Ramaraju et al. | |
| 8,625,365 B2 | | 1/2014 | Sanjeevarao et al. | |

(Continued)

FOREIGN PATENT DOCUMENTS

| | | |
|---|---|---|
| JP | 2000207289 A | 7/2000 |
| JP | 2013196644 A | 9/2013 |
| JP | 6398390 B2 | 10/2018 |

*Primary Examiner* — Vanthu T Nguyen

(74) *Attorney, Agent, or Firm* — Muir Patent Law, PLLC

(57) ABSTRACT

A memory device having fault detection functionality for improving functional safety and a control system including the memory device are provided. The memory device includes a first memory cell array configured to store input data and output the input data as output data and a second memory cell array configured to store bit values of a row address and a column address of the first memory cell array in which the input data is stored, and output the bit values of the row address and the column address as an internal row address and an internal column address. The row/column address designating a read operation may be compared to the internal row/column address, and an address comparison signal as a result of the comparison may be output. The address comparison signal may provide fault detection functionality for a data error of an automotive electronic system.

20 Claims, 13 Drawing Sheets

(56) References Cited

U.S. PATENT DOCUMENTS

| | | | |
|---|---|---|---|
| 9,490,031 B2 | 11/2016 | Remington | |
| 10,019,367 B2 * | 7/2018 | O | G11C 5/04 |
| 10,109,337 B2 | 10/2018 | Yokoyama et al. | |
| 10,120,741 B2 * | 11/2018 | Ishii | G11C 29/024 |
| 10,235,258 B2 * | 3/2019 | Son | G11C 29/42 |
| 2009/0037782 A1 | 2/2009 | Hughes | |
| 2016/0092293 A1 | 3/2016 | Ishii et al. | |
| 2018/0150352 A1 | 5/2018 | Adham et al. | |

* cited by examiner

MEMORY DEVICE HAVING FAULT DETECTION FUNCTIONALITY AND CONTROL SYSTEM INCLUDING THE SAME

CROSS-REFERENCE TO RELATED APPLICATION

This application claims the benefit of Korean Patent Application No. 10-2019-0161671, filed on Dec. 6, 2019, in the Korean Intellectual Property Office, the disclosure of which is incorporated herein in its entirety by reference.

BACKGROUND

The disclosure relates to a memory device, and more particularly, to a memory device capable of improving functional safety by performing fault detection functionality used by an automotive electronic system, and a control system including the memory device.

Unlike devices for general electronic products, the malfunction of electronic devices (for example, Electronic Control Units (ECUs)) mounted on automotive vehicles may apply a fatal risk to the safety of the automotive vehicles in some cases. As a portion of electronic devices in an automotive vehicle increases, electronic devices for an automotive vehicle are needed functional safety as an important factor. Functional safety means that there is no unreasonable risk, that is, that risk levels are reasonable. Reasonable risk means managing the generation probability of a malfunction to a reasonable level according to the rating of an electronic device. An Automobile Safety Integrity Level (ASIL) for providing risk management criterion may be assigned to individual electronic devices in an automotive vehicle. ASIL ratings are classified from ASIL-A to ASIL-D in the ascending order of criteria required for risk management. The rating of ASIL-D represents a highest integrity requirement and is applied to safety-related processing tasks. ASIL-D electronic devices need to identify safety-related faults in units of arithmetic, logic, and memory.

Inputs sensed by various sensors mounted on an automotive vehicle are transferred to an electronic control unit (ECU) to control the operations of the automotive vehicle. To easily control the operations of the automotive vehicle, the ECU may include a processor and a memory device storing operation parameters, user inputs, sensor data, and/or data such as instructions that are executable by the processor. Because a test for main functional parameters of a memory device is conducted in the wafer level of Integrated Circuits (ICs) before the memory device is mounted on an automotive vehicle, an opportunity to test the memory device in regard to whether the memory device operates properly and/or there is a fault after the memory device is installed in the automotive vehicle is limited. Accordingly, a method of detecting a fault of a memory device included in an electronic device requiring a high safety level such as the ASIL-D rating is needed.

SUMMARY

The present disclosure provides a memory device having fault detection functionality for improving functional safety, an operation method of the memory device, and a control system including the memory device.

A memory device according to example embodiments of the disclosure includes: a first memory cell array including a plurality of first memory cells at corresponding intersections of a plurality of first bit lines and word lines, each word line connected to a corresponding one of a plurality of memory cell rows; a second memory cell array positioned adjacent to the first memory cell array, and including a plurality of second memory cells at corresponding intersections of a plurality of second bit lines and the word lines extending from the first memory cell array; a control logic block configured to control a write operation and a read operation of the first memory cell array and the second memory cell array, receive an address signal including a row address signal for addressing the word lines and a column address signal for addressing the a plurality of first bit lines, store, when the write operation is performed, bit values of the row address signal and the column address signal in the plurality of second memory cells of the second memory cell array in correspondence to the row address signal and the column address signal, and output, when the read operation is performed, the bit values of the row address signal and the column address signal stored in the plurality of second memory cells of the second memory cell array in correspondence to the row address signal and the column address signal, as an internal row address signal and an internal column address signal; and a first comparator configured to receive the row address signal and the column address signal designating the read operation, compare the row address signal to the internal row address signal, compare the column address signal to the internal column address signal, and output an address comparison signal as a result of the comparison.

A method of operating a memory device for providing fault detection of the memory device including first and second memory cell arrays, according to example embodiments of the disclosure, includes: receiving a row address signal and a column address signal designating a write operation of the memory device; storing input data in first memory cells of the first memory cell array, in correspondence to the address signal and the column address signal; storing bit values of the row address signal and the column address signal in second memory cells of the second memory cell array in correspondence to the row address signal and the column address signal; receiving the row address signal and the column address signal designating a read operation of the memory device; outputting the bit values of the row address signal and the column address signal stored in the second memory cells of the second memory cell array in correspondence to the row address signal and the column address signal, as an internal row address signal and an internal column address signal; comparing the row address signal to the internal row address signal and comparing the column address signal to the internal column address signal; and outputting an address comparison signal representing address match or address mismatch as a result of the comparing.

A control system for controlling an operation of an electronic system, according to example embodiments of the disclosure, includes: a memory device configured to store input data related to an operation of the electronic system; and a processor communicatively connected to the memory device and configured to detect a fault for a data error of the memory device. The memory device includes: a first memory cell array including first memory cells storing the input data; a second memory cell array including second memory cells storing copies of a row address signal and a column address signal for addressing the first memory cells storing the input data; a control logic block configured to control a write operation and a read operation of the memory device, store, when the write operation is performed, bit values of the row address signal and the column address signal, and output, when the read operation is performed, the bit values of the row address signal and the column address signal stored in the second memory cells of the second memory cell array, as an internal row address signal and an internal column address signal; and a first comparator configured to receive the row address signal and the column address signal designating the read operation, compare the row address signal to the internal row address signal, compare the column address signal to the internal column address signal, output an address comparison signal as a result of the comparison, and provide the address comparison signal to the processor, wherein the processor is further configured to detect the fault for the data error of the memory device from the address comparison signal.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
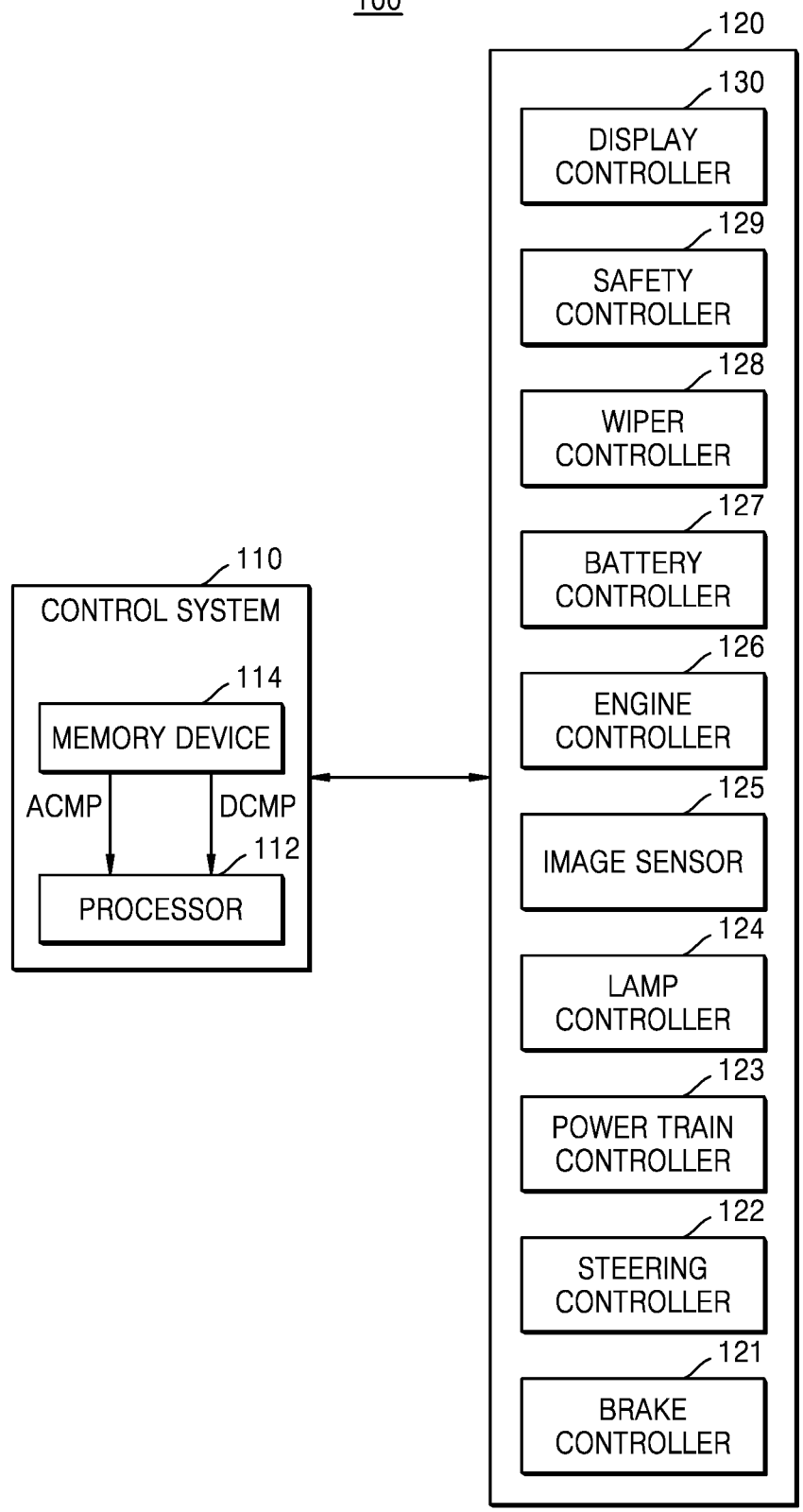
FIG. 1 is a diagram for describing an automotive electronic system according to example embodiments of the disclosure.

FIG. 1 is a diagram for describing an automotive electronic system according to example embodiments of the disclosure.

Referring to FIG. 1, an automotive electronic system 100 may be composed of a plurality of functional elements included in an automotive vehicle, and include a control system 110 and a plurality of electronic devices 120. The control system 110 may be connected to and communicate with the electronic devices 120 through an intra vehicle network. The intra vehicle network may be a controller area network (CAN), a flexray-based network, a media oriented system transport (MOST)-based network, etc. In some embodiments, the control system 110 may be connected to and communicate with the electronic devices 120 through an external communication network. The external communication network may include a personal area network (PAN) such as a Bluetooth network, a local area network (LAN) such as an 802.11x WiFi network, and/or a wide area network (WAN) such as a 4$^{th}$ Generation (4G) network or a long term evolution (LTE) cellular network.

In some examples, the terms "coupled" and "connected" may be used together with their derivatives and described. However, the terms are necessarily not intended as synonyms. For example, descriptions using the terms "connected" and/or "coupled" may represent a state in which two or more elements physically or electrically contact each other. Also, the term "coupling" means a state in which two or more elements cooperate or interact with each other although not contacting each other.

The control system 110 may control operations of the automotive electronic system 100. The control system 110 may include a processor 112 and a memory device 114 connected to and communicating with the processor 112. The control system 110 may control operations of the automotive electronic system 100 based on a user's instruction, and the user's instruction may be received as a user's input through a steering wheel, a brake pedal, and/or a button. The control system 110 may autonomously control operations of at least one portion of the automotive electronic system 100 according to a user's instruction or without receiving a user's instruction. For example, when an advanced driver assistance system (ADAS) is executed, the control system 110 may determine operation parameters, such as a distance to a surrounding object, a direction of the automotive vehicle, and/or a speed of the automotive vehicle, from the memory device 114, and autonomously instruct, when a collision with the surrounding object is expected, the automotive vehicle to apply a brake. Also, when an autonomous driving system is executed, the control system 110 may determine operation parameters, such as a current location of the automotive vehicle, a target destination of the automotive vehicle, a route from the current location to the target destination, and/or operational constraints according to the route, from the memory device 114, and control the automotive vehicle to travel from the current location to the target destination. An automobile safety integrity level (ASIL) rating of the automotive electronic system 100 may be ASIL-D corresponding to a high rating.

The processor 112 may perform operations for controlling overall operations of the automotive electronic system 100. The processor 112 may perform a task or process based on at least a portion of the operation parameters of the automotive electronic system 100, sensor data, and/or data stored in the memory device 114. When a specific task or a specific process is executed, the processor 112 may need access to data of the memory device 114, that is, the processor 112 may need to store data in the memory device 114 or output data from the memory device 114. The processor 112 and the memory device 114 may have a common time base such that time-driven storage and outputs of data are performed to correspond to an execution time of a task or process. The common time base may be realized through, for example, a common clock or an appropriate synchronization mechanism.

The processor 112 may access the data of the memory device 114. The memory device 114 may store and/or output data received from the electronic devices 120, such as user input data, sensor data, a control command, data to be processed by the processor 112, and/or an instruction that is executable by the processor 112. The memory device 114 may include volatile memory (for example, static random access memory (SRAM) or dynamic random access memory (DRAM)) and/or non-volatile memory (for example, flash memory, resistive RAM (RRAM), magnetic RAM (MRAM), or phase change RAM (PRAM)). Hereinafter, the memory device 114 is described to be SRAM, however, the technical concept of the disclosure is not limited to SRAM.

The electronic devices 120 may include a plurality of functional elements connected to the control system 110. More specifically, the electronic device 120 may include a brake controller 121, a steering controller 122, a power train controller 123, a lamp controller 124, an image sensor 125, an engine controller 126, a battery controller 127, a wiper controller 128, a safety controller 129, and a display controller 130.

The brake controller 121 may include a plurality of sensors for sensing a state of the brake. The brake controller 121 may transmit a result of sensing by the sensors to the control system 110. The brake controller 121 may receive a control command from the control system 110. The brake controller 121 may control the brake according to the control command.

The steering controller 122 may include a plurality of sensors for sensing a state of a steering unit. The steering controller 122 may transmit a result of sensing by the sensors to the control system 110. The steering controller 122 may receive a control command from the control system 110. The steering controller 122 may control the steering unit according to the control command.

Likewise, the power train controller 123 may transmit a result of sensing by a plurality of sensors with respect to a power train to the control system 110. The power train controller 123 may control the power train according to a control command from the control system 110.

The lamp controller 124 may transmit a result of sensing by a plurality of sensors with respect to a plurality of lamps to the control system 110. The lamp controller 124 may control the lamps according to a control command from the control system 110.

The image sensor 125 may encode a scene in a field of view into image data and transmit the image data to the control system 110.

The engine controller 126 may transmit a result of sensing by a plurality of sensors with respect to an engine to the control system 110. The engine controller 126 may control the engine according to a control command from the control system 110.

The battery controller 127 may transmit information about a state of a battery to the control system 110. The battery controller 127 may control a setting of the battery according to the control command from the control system 110.

The wiper controller 128 may transmit a result of sensing by a plurality of sensors with respect to an outside environment (for example, whether it is raining) to the control system 110. The wiper controller 128 may control wipers according to a control command from the control system 110.

The safety controller 129 may transmit a result of sensing by a plurality of sensors with respect to safety devices, such as seat belts, airbags, an electronic controlled suspension (ECS), etc., to the control system 110. Also, the safety controller 129 may transmit a result of sensing with respect to an outside environment (for example, tilting, falling, collision, etc.) to the control system 110. The safety controller 129 may control the safety devices according to a control command from the control system 110.

The display controller 130 may transmit a result of sensing with respect to an outside environment (for example, illumination intensity, moving speed, etc.) The display controller 130 may adjust illumination intensity of a display or limit content to be displayed, according to a control command from the control system 110.

The control system 110 and the electronic devices 120 may be implemented as hardware circuits including semiconductors, such as custom very large scale interface (VLSI) circuits, gate arrays, logic chips, transistors, or other discrete components. The control system 110 and the electronic devices 120 may be implemented as programmable hardware devices, for example, programmable gate arrays, programmable gate logics, programmable gate devices, etc. Also, the control system 110 and the electronic devices 120 may be implemented as software configured with executable code, objects, procedures, or functions.

The control system 110 may autonomously control at least one operation of the automotive vehicle based on data retrieved from the memory device 114. A generation of an error or fault in the memory device 114 may affect operational reliability of the control system 110, furthermore, the automotive electronic system 100.

Accordingly, the disclosure provides techniques for improving functional safety of the automotive electronic system 100 by detecting or identifying a fault based on error detection functionality of the memory device 114 in the control system 110. To easily reduce influence of memory errors (or, data errors), the control system 110 may determine an error parameter such as a location of a memory error (or, data error) using an address comparison signal ACMP and/or a data comparison signal DCMP provided from the memory device 114, and provide fault detection functionality, before performing an operation based on data of the memory device 114. The fault detection functionality may satisfy an ASIL-D requirement using a high safety level.

According to an embodiment of the disclosure, the functional elements of the electronic devices 120 may include devices that are similar to the processor 112 and the memory device 114 operating on the control system 110 to provide functions of the processor 112 and the memory device 114. For example, processors and local memory devices may be individually included in the brake controller 121, the steering controller 122, the power train controller 123, the lamp controller 124, the image sensor 125, the engine controller 126, the battery controller 127, the wiper controller 128, the safety controller 129, and/or the display controller 130. The local memory device included in each of the functional elements of the electronic devices 120 may be accessed by the corresponding processor, and store and/or output user input data for the corresponding functional element, sensor data being a result of sensing by a sensor, and/or a control command from the control system 110. The local memory device included in each of the functional elements of the electronic devices 120 may also determine an error parameter such as a location of a memory error using an address comparison signal and/or a data comparison signal provided from the local memory device, and provide fault detection functionality.

Figure 2:
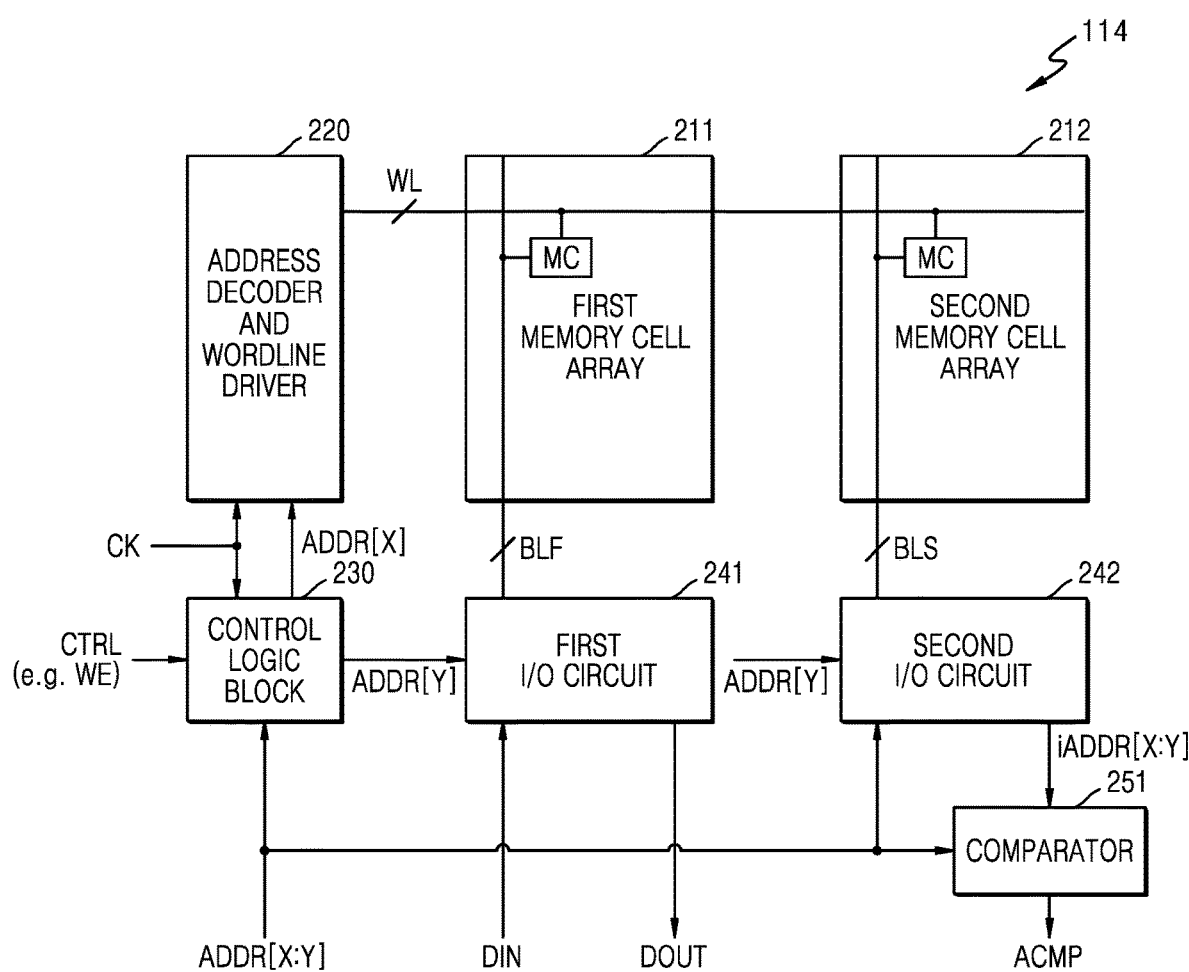
FIG. 2 is a block diagram for describing a memory device according to example embodiments of the disclosure.

FIG. 2 is a block diagram for describing the memory device 114 according to example embodiments of the disclosure.

Referring to FIGS. 1 and 2, the memory device 114 may include a first memory cell array 211, a second memory cell array 212, an address decoder and wordline driver 220, a control logic block 230, a first input/output (I/O) circuit 241, a second input/output circuit 242, and a comparator 251.

Each of the first and second memory cell arrays 211 and 212 may include a plurality of memory cells MC provided as a two-dimensional matrix in which a plurality of rows and a plurality of columns are arranged. The first and second memory cell arrays 211 and 212 may include a plurality of word lines WL and a plurality of bit lines BLF and BLS, which are connected to the respective memory cell MC. The memory cells MC of the first and second memory cell arrays 211 and 212 may be the same kind of memory cells and may be a plurality of rewritable SRAM cells. For example, the memory cells MC may be a plurality of 6-transistor SRAM cells.

The plurality of word lines WL may be respectively provided to individual memory cell rows of the first memory cell array 211. The plurality of bit lines BLF may be respectively provided to individual memory cell columns of the first memory cell array 211. Each bit line BLF may be implemented as a pair of bit lines including a bit line BL and a complementary bit line /BL.

The second memory cell array 212 may be adjacent to the first memory cell array 211 in a column direction of the first memory cell array 211. Memory cell rows of the second memory cell array 212 may be respectively connected to the word lines WL connected to the respective memory cell rows of the first memory cell array 211. The word lines WL may be respectively connected to the memory cell rows of the first and second memory cell arrays 211 and 212. For example, the word lines WL may extend to both the first and second memory cell arrays 211 and 212. The bit lines BLS may be provided to the respective memory cell columns of the second memory cell array 212, and each bit line BLS may be implemented as a pair of bit lines including a bit line BL and a complementary bit line /BL.

The address decoder and wordline driver 220 may drive the word lines WL respectively connected to the memory cell rows of the first and second memory cell arrays 211 and 212. The address decoder and wordline driver 220 may operate in synchronization with a clock signal CK. The clock signal CK may be provided from the processor 112 (see FIG. 1). The address decoder and wordline driver 220 may receive a row address signal ADDR[X] in response to the clock signal CK, decode the row address signal ADDR[X], and enable a word line WL of the memory cell rows of the first and second memory cell arrays 211 and 212 according to the decoded row address signal ADDR[X]. For example, a word line WL corresponding to the row address signal ADDR[X] among the plurality of word lines WL of the first and second memory cell arrays 211 and 212 may be activated.

The control logic block 230 may operate in synchronization with the clock signal CK. The control logic block 230 may receive an address signal ADDR[X:Y] and/or a control signal CTRL from the processor 112 (see FIG. 1) in response to the clock signal CK. The address signal ADDR[X:Y] may include a row address signal ADDR[X] and a column address signal ADDR[Y], and the control signal CTRL may include a write enable signal WE. The address signal ADDR[X:Y] may be provided to the second input/output circuit 242 and the comparator 251. The control logic block 230 may output various internal control signals to perform a write operation and/or a read operation on the first and second memory cell arrays 211 and 212, based on the address signal ADDR[X:Y] and the control signal CTRL.

When the write enable signal WE is activated, the control logic block 230 may perform a write operation on the first and second memory cell arrays 211 and 212, and when the write enable signal WE is inactivated, the control logic block 230 may perform a read operation on the first and second memory cell arrays 211 and 212. The control logic block 230 may provide the row address signal ADDR[X] of the address signal ADDR[X:Y] to the address decoder and wordline driver 220 and the column address signal ADDR[Y] to the first input/output circuit 241. When a read operation is performed on the first and second memory cell arrays 211 and 212, the control logic block 230 may provide an address signal ADDR[X:Y] designating the read operation to the comparator 251.

The first input/output circuit 241 may include a column decoder for decoding a column address signal ADDR[Y] and a column selection circuit for selecting bit lines BLF of the first memory cell array 211 according to the decoded column address signal. Bit lines corresponding to the column address signal ADDR[Y] among the plurality of bit lines BLF of the first memory cell array 211 may be selected. For easy understanding with reference to FIG. 2, the first input/output circuit 241 is described to include the column decoder and the column selection circuit of the first memory cell array 211. However, the column decoder and the column selection circuit of the first memory cell array 211 may be separated from the first input/output circuit 241.

The first and second input/output circuits 241 and 242 may be provided as data input/output circuits of the first and second memory cell arrays 211 and 212, respectively. The first and second input/output circuits 241 and 242 may operate as write drivers or sensing amplifiers according to a control of the control logic block 230. The first and second input/output circuits 241 and 242 may operate as write drivers when a write operation is performed and operate as sensing amplifiers when a read operation is performed.

When a write operation is performed, the first input/output circuit 241 may receive input data DIN to be written to the first memory cell array 211 according to a control of the control logic block 230, and write the input data DIN on memory cells MC selected from the first memory cell array 211. The input data DIN may be written to memory cells MC of the first memory cell array 211, the memory cells MC connected to a word line WL activated in correspondence to a row address signal ADDR[X] and bit lines BLF selected in correspondence to a column address signal ADDR[Y].

When the write operation is performed, the second input/output circuit 242 may receive an address signal ADDR[X:Y] according to a control of the control logic block 230, and write a copy of the address signal ADDR[X:Y] on memory cells MC selected from the second memory cell array 212, which correspond to the column address signal ADDR[Y]. The copy of the address signal ADDR[X:Y] may be bit values of the row address signal ADDR[X] and the column address signal ADDR[Y] used to select the memory cells MC of the first memory cell array 211, to which the input data DIN is written. For example, when the row address signal ADDR[X] is "0" and the column address signal ADDR[Y] is "1", copies of the row address signal ADDR[X] and the column address signal ADDR[Y] are "01". The copy of the address signal ADDR[X:Y] may be written to the memory cells MC of the second memory cell array 212 connected to the word line WL activated in correspondence to the row address signal ADDR[X], through the bit lines BLS. For example, the memory cells MC of the second memory cell array 212, which correspond to the row address signal ADDR[X], may store copies of the row address signal ADDR[X] and the column address signal ADDR[Y], by which the input data DIN is written to the first memory cell array 211.

In some embodiments, the number of memory cells MC of the second memory cell array 212 connected to a word line WL, which correspond to the row address signal ADDR[X], may be equal to the number of bits of 32 ($=2^5$) (e.g., the number of the column address ADDR[Y] is 5) multiplied by the number of bits of the address signal ADDR[X:Y], which is a sum of the number of bits of the row address signal ADDR[X] and the number of bits of the column address signal ADDR[Y]. and the number of bit lines BLS of the second memory cell array 212 may also be equal to the number of bits of the address signal ADDR[X:Y].

The first and second input/output circuits 241 and 242 may read data of memory cells MC selected from the first and second memory cell arrays 211 and 212 according to a control of the control logic block 230. The read data may be stored in latches included in the first and second input/output circuits 241 and 242.

When a read operation is performed, the first input/output circuit 241 may sense data of the memory cells MC of the first memory cell array 211, the memory cells MC connected to the word line WL activated in correspondence to the row address signal ADDR[X] and the bit lines BLF selected in correspondence to the column address signal ADDR[Y], and store the sensed data in the latches. The first input/output circuit 241 may output the data stored in the latches as output data DOUT according to a control of the control logic block 230. For example, the input data DIN written to the memory cells MC of the first memory cell array 211, the memory cells MC connected to the word line WL activated in correspondence to the row address signal ADDR[X] and the bit lines BLF selected in correspondence to the column address signal ADDR[Y] may be output as the output data DOUT.

When the read operation is performed, the second input/output circuit 242 may sense data of the memory cells MC of the second memory cell array 212, the memory cells MC connected to the word line WL activated in correspondence to the row address signal ADDR[X], and store the data in the latches of the second input/output circuit 242. The second input/output circuit 242 may output the data stored in the latches as an internal address signal iADDR[X:Y] according to a control of the control logic block 230. For example, the copy of the address signal ADDR[X:Y] written to the memory cells MC of the second memory cell array 212, the memory cells MC connected to the word line WL activated in correspondence to the row address signal ADDR[X], may be output as the internal address signal iADDR[X:Y]. The internal address signal iADDR[X:Y] may be provided to the comparator 251.

When the read operation is performed, the comparator 251 may latch an address signal ADDR[X:Y] received by the memory device 114, and compare the latched address signal ADDR[X:Y] to the internal address signal iADDR[X:Y] output from the second input/output circuit 242. The comparator 251 may compare the address signal ADDR[X:Y] designating the read operation to the internal address signal iADDR[X:Y] read from the second memory cell array 212 at a read operation timing corresponding to the address signal ADDR[X:Y] to determine whether the address signal ADDR[X:Y] matches with the internal address signal iADDR[X:Y]. The comparator 251 may compare each bit of the address signal ADDR[X:Y] to the corresponding bit of a row address signal ADDR[X] of the internal address signal iADDR[X:Y], and compare each bit of the address signal ADDR[X:Y] to the corresponding bit of a column address signal ADDR[Y] of the internal address signal iADDR[X:Y]. The comparator 251 may output an address comparison signal ACMP as a result of the comparing.

When the result of the comparing represents address match, the comparator 251 may determine that the address signal ADDR[X:Y] designating the read operation includes no memory error, and output the address comparison signal ACMP, for example, as logic "0". When the result of the comparing represents address mismatch, the comparator 251 may determine that the address signal ADDR[X:Y] designating the read operation includes a memory error, and output the address comparison signal ACMP, for example, as logic "1". Accordingly, the address comparison signal ACMP may provide fault detection functionality for a memory error. The address comparison signal ACMP may be provided to the processor 112.

Figure 3:
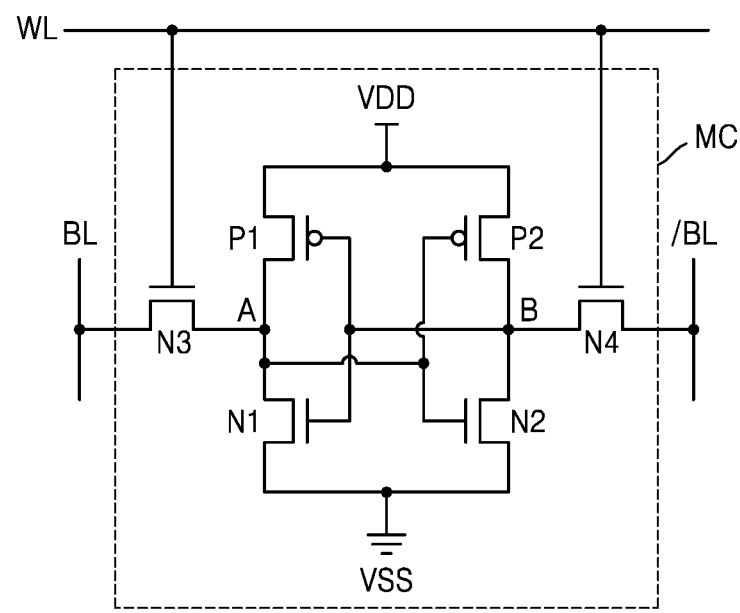
FIG. 3 is a circuit diagram for describing a memory cell in first and second cell arrays of FIG. 2.

FIG. 3 is a circuit diagram for describing a memory cell MC in the first and second cell arrays 211 and 212 of FIG. 2. For convenience of description, a bit line BL represents one of the bit lines BLF and BLS of the first and second memory cell arrays 211 and 212 and bit lines BLT of a third memory cell array 213 which will be described later with reference to FIGS. 8A and 8B.

Referring to FIG. 3, the memory cell MC may be an SRAM cell configured with 6 transistors. The memory cell MC may also be called a 6T SRAM cell. However, the inventive concept is not limited to this example. For example, the memory cell MC may be an SRAM cell configured with 4 transistors and 2 resistors. The memory cell MC may also be called a 4T and 2R SRAM cell. The memory cell MC may include PMOS transistors P1 and P2 respectively connected between a supply voltage (VDD) line and nodes A and B, and NMOS transistors N1 and N2 respectively connected between a ground voltage (VSS) line and the nodes A and B. The node A may be connected to gates of the PMOS and NMOS transistors P2 and N2, and the node B may be connected to gates of the PMOS and NMOS transistors P1 and N1. The nodes A and B may be respectively connected to a bit line BL and a complementary bit line /BL by NMOS transistors N3 and N4. Gates of the NMOS transistors N3 and N4 may be connected to a word line WL. The NMOS transistors N3 and N4 may be referred to as access transistors or pass transistors. The memory cell MC may store the data and the complementary data at the nodes A and B at which an inverter configured with the PMOS and NMOS transistors P1 and N1 is cross-connected or cross-coupled to an inverter configured with the PMOS and NMOS transistors P2 and N2, and may be maintained in a state of latching the data and the complementary data.

When the word line WL is enabled in a write operation, the memory cell MC may latch data and complementary data transferred from the bit line BL and the complementary bit line /BL through the NMOS transistors N3 and N4 at the nodes A and B. When the word line WL is enabled in a read operation, data latched at the nodes A and B may be transmitted to the bit line BL and the complementary bit line /BL through the NMOS transistors N3 and N4.

Figure 4A:
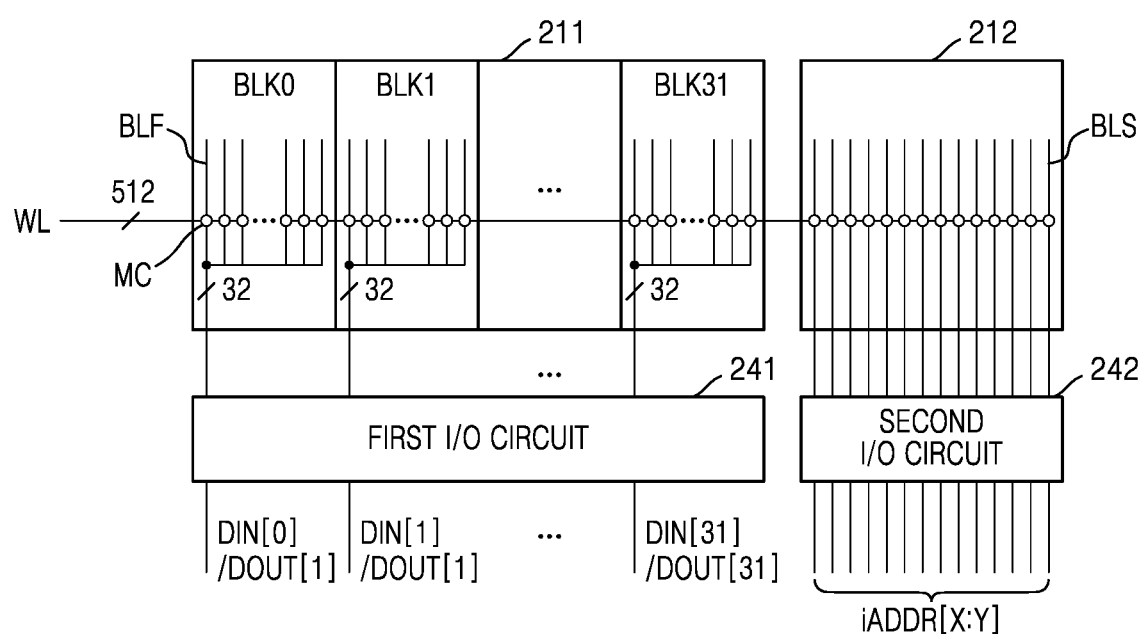
FIGS. 4A and 4B are diagrams for describing portions of exemplary structures of first and second memory cells of FIG. 2 according to example embodiments.
Figure 4B:
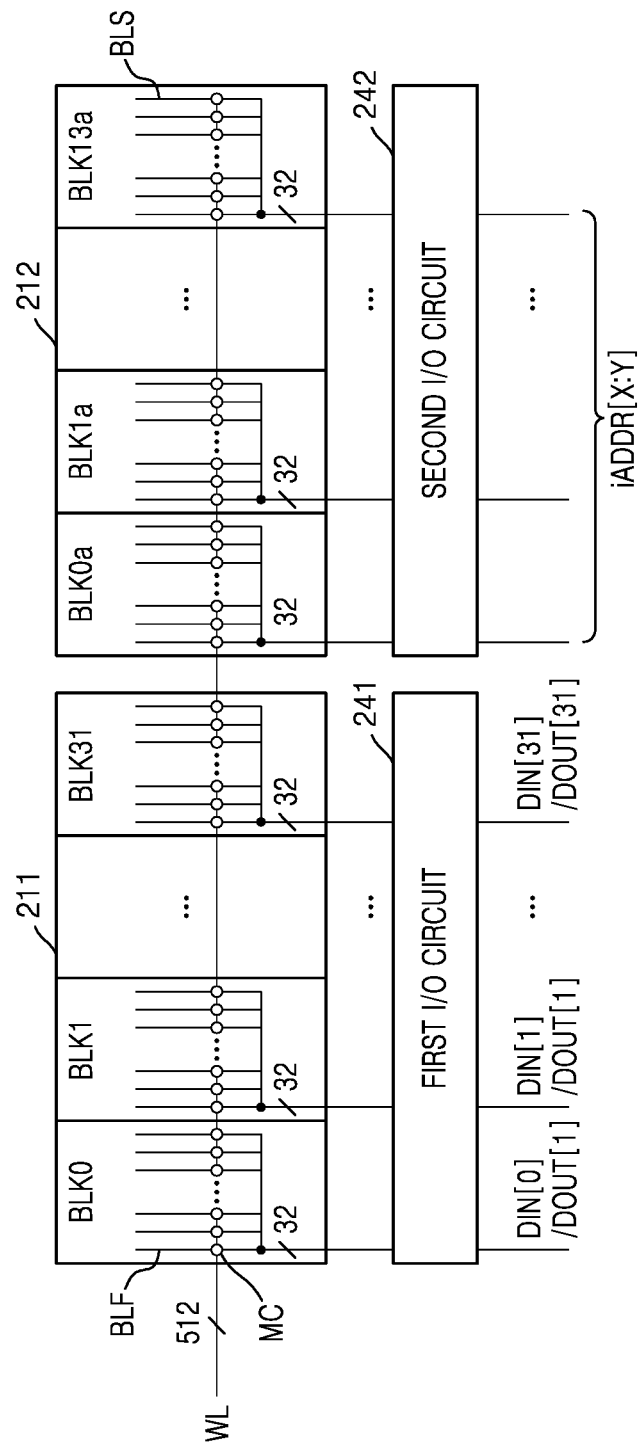

FIGS. 4A and 4B are diagrams for describing portions of exemplary structures of the first and second memory cell arrays 211 and 212 of FIG. 2 according to example embodiments.

Referring to FIGS. 2 and 4A, the first memory cell array 211 may be configured to have, for example, memory capacity of 64 KB and a data input/output (I/O) structure of 32 bits. The first memory cell array 211 may include 32 memory blocks BLK0 to BLK31. Each of the memory blocks BLK0 to BLK31 may include memory cells MC at corresponding intersections of 512 word lines WL and 32 bit lines BLF. When a word line WL of 512 word lines WL is activated and a bit line BLF of 32 bit lines BLF is selected in each of the memory blocks BLK0 to BLK31, an operation of data writing/reading to/from memory cells MC connected to the activated word line WL and the selected bit lines BLF may be performed.

The 512 word lines WL of each of the memory blocks BLK0 to BLK 31 may be addressed by a row address signal ADDR[X] of 9 bits, and the 32 bit lines BLF of each of the memory blocks BLK0 to BLK 31 may be addressed by a column address signal ADDR[Y] of 5 bits. Accordingly, an address signal ADDR[X:Y] may be configured with a total of 14 bits which are a sum of the 9 bits of the row address signal ADDR[X] and the 5 bits of the column address signal ADDR[Y].

The second memory cell array 212, as shown in FIG. 4B, may include 14 memory blocks BLK0a to BLK13a. The second memory cell array 212 may include a plurality of memory cells MC at corresponding intersections of 512 word lines WL extending from the word lines WL of the first memory cell array 211 and 32×14 bit lines BLS (e.g., 14 is a sum of the number of bits of the row address signal ADDR[X] and the number of bits of the column address signal ADDR[Y]). For example, the number of memory cells connected to one word line WL of 512 word lines WL may be 32×14 memory cells. When a word line WL of 512 word lines WL is activated and 14 bit lines BLS are selected in the second memory cell array 212, an operation of address writing/reading to/from memory cells MC connected to the activated word line WL and the selected bit lines BLS may be performed.

When a write operation is performed, an address signal ADDR[X:Y] designating a write operation may be received by the memory device 114. In the first memory cell array 211, a word line WL corresponding to a row address signal ADDR[X] of 9 bits may be activated, and in the memory blocks BLK0 to BLK31, memory cells MC connected to bit lines BLF corresponding to a column address signal ADDR[Y] of 5 bits may be selected from among memory cells MC connected to the activated word line WL, so that 32 memory cells MC of the first memory cell array 211 may be selected. Therefore, 32 input data DIN[31:0] may be respectively written to the 32 selected memory cells MC of the memory blocks BLK0 to BLK31 through the first input/output circuit 241. Also, in the second memory cell array 212, a copy of the address signal ADDR[X:Y] designating the write operation may be written to 14 memory cells MC connected to the activated word line WL through the second input/output circuit 242. Each of the 14 memory cells MC connected to the activated word line WL is selected among 32 memory cells MC by the second input/output circuit 242 corresponding to the column address signal ADDR[Y] of 5 bits. For example, the second memory cell array 212 may store copies of the row address signal ADDR[X] of 9 bits and the column address signal ADDR[Y] of 5 bits, by which the input data DIN[31:0] is written to the first memory cell array 211, in the 14 memory cells MC of the second memory cell array 212.

When a read operation is performed, an address signal ADDR[X:Y] designating a read operation may be received by the memory device 114. In the first memory cell array 211, a word line WL corresponding to a row address signal ADDR[X] of 9 bits may be activated, and in the memory blocks BLK0 to BLK31, memory cells MC connected to bit lines BLF corresponding to a column address signal ADDR[Y] of 5 bits may be selected from among memory cells MC connected to the activated word line WL, so that 32 memory cells MC of the first memory cell array 211 may be selected. Data of the 32 selected memory cells MC may be sensed and output as 32 pieces of output data DOUT[31:0] through the first input/output circuit 241. Also, in the second memory cell array 212, data of 14 memory cells MC connected to the activated word line WL may be sensed and output as an internal address signal iADDR[X:Y] through the second input/output circuit 242. The internal address signal iADDR[X:Y] may be configured with an internal row address signal iADDR[X] of 9 bits and an internal column address signal iADDR[Y] of 5 bits.

The internal address signal iADDR[X:Y] read from the second memory cell array 212 may be provided to the comparator 251. The comparator 251 may determine whether the address signal ADDR[X:Y] designating the read operation matches with the internal address signal iADDR[X:Y] read from the second memory cell array 212. The comparator 251 may compare each bit of the row address signal ADDR[X] of 9 bits to the corresponding bit of the internal row address signal iADDR[X] of 9 bits, and compare each bit of the column address signal ADDR[Y] of 5 bits to the corresponding bit of the internal column address signal iADDR[Y] of 5 bits. The comparator 251 may output an address comparison signal ACMP representing address match or address mismatch as results of the comparing and provide the address comparison signal ACMP to the processor 112. The comparator 251 may include a plurality of XOR logic gates or a plurality of XNOR logic gates. Thus, the comparator 251 may function an exclusive OR (XOR) operation or an exclusive NOR (XNOR) operation to compare the address signal ADDR[X:Y] with the internal address signal iADDR[X:Y].

In example embodiments, when the memory device 114 has 2 row addresses X1 and X2 and 2 column addresses Y1 and Y2, the second memory cell array 212 may include 64 (16×4) memory cells. For example, data of the address signal [X:Y] are stored in 64 memory cells as shown in Table 1 below. In Table 1, when the address signal [X:Y] is [X1:X2] "01" and [Y1:Y2] "11", a second word line WL1 and respective bit lines BLS of memory cells corresponding to [Y1:Y2] "11" are selected. In a write operation, when the address signal [X:Y] is "0111", 4 memory cells connected to the second word line WL1 corresponding to row address signal [X1:X2] "01" and bit lines BLS corresponding to the column address signal [Y1:Y2] "11" are selected and bit values of the address signal [X:Y] are stored in the 4 selected memory cells as data "0111". In a read operation, when the address signal [X:Y] is "0111", 4 memory cells connected to the second word line WL1 corresponding to row address signal [X1:X2] "01" and bit lines BLS corresponding to the column address signal [Y1:Y2] "11" are selected and bit values of the address signal [X:Y] are read from the 4 selected memory cells as data "0111".

TABLE 1

|  | X1 | | | | X2 | | | | Y1 | | | | Y2 | | | |
|---|---|---|---|---|---|---|---|---|---|---|---|---|---|---|---|---|
| WL3 | 1 | 1 | 1 | 1 | 1 | 1 | 1 | 1 | 0 | 0 | 1 | 1 | 0 | 1 | 0 | 1 |
| WL2 | 1 | 1 | 1 | 1 | 0 | 0 | 0 | 0 | 0 | 0 | 1 | 1 | 0 | 1 | 0 | 1 |
| WL1 | 0 | 0 | 0 | 0 | 1 | 1 | 1 | 1 | 0 | 0 | 1 | 1 | 0 | 1 | 0 | 1 |
| WL0 | 0 | 0 | 0 | 0 | 0 | 0 | 0 | 0 | 0 | 0 | 1 | 1 | 0 | 1 | 0 | 1 |
| [Y1:Y2] | 00 | 01 | 10 | 11 | 00 | 01 | 10 | 11 | 00 | 01 | 10 | 11 | 00 | 01 | 10 | 11 |

Figure 5:
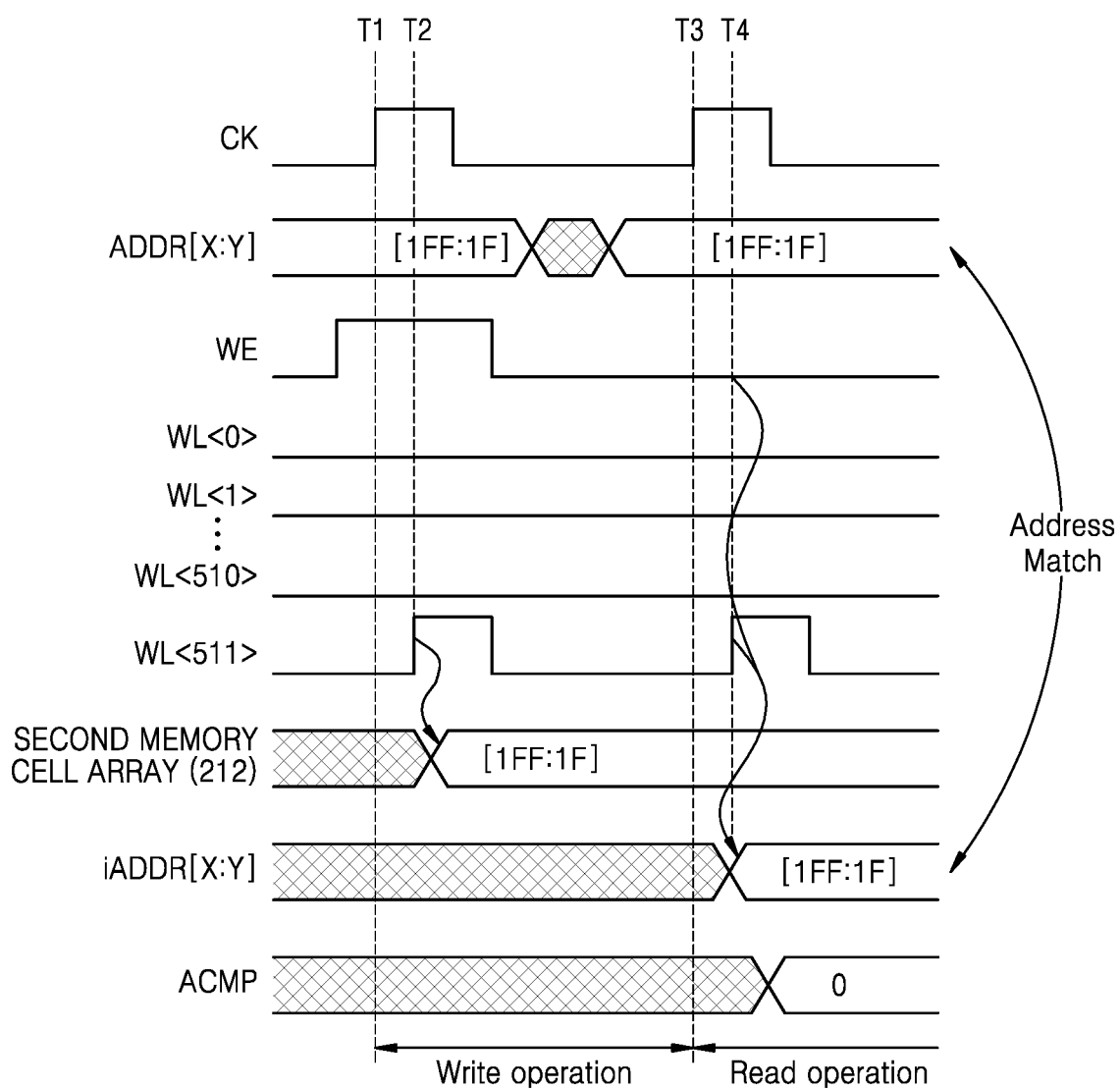
FIGS. 5 to 7 are timing diagrams for describing operations of the memory device of FIG. 2 according to example embodiments.
Figure 6:
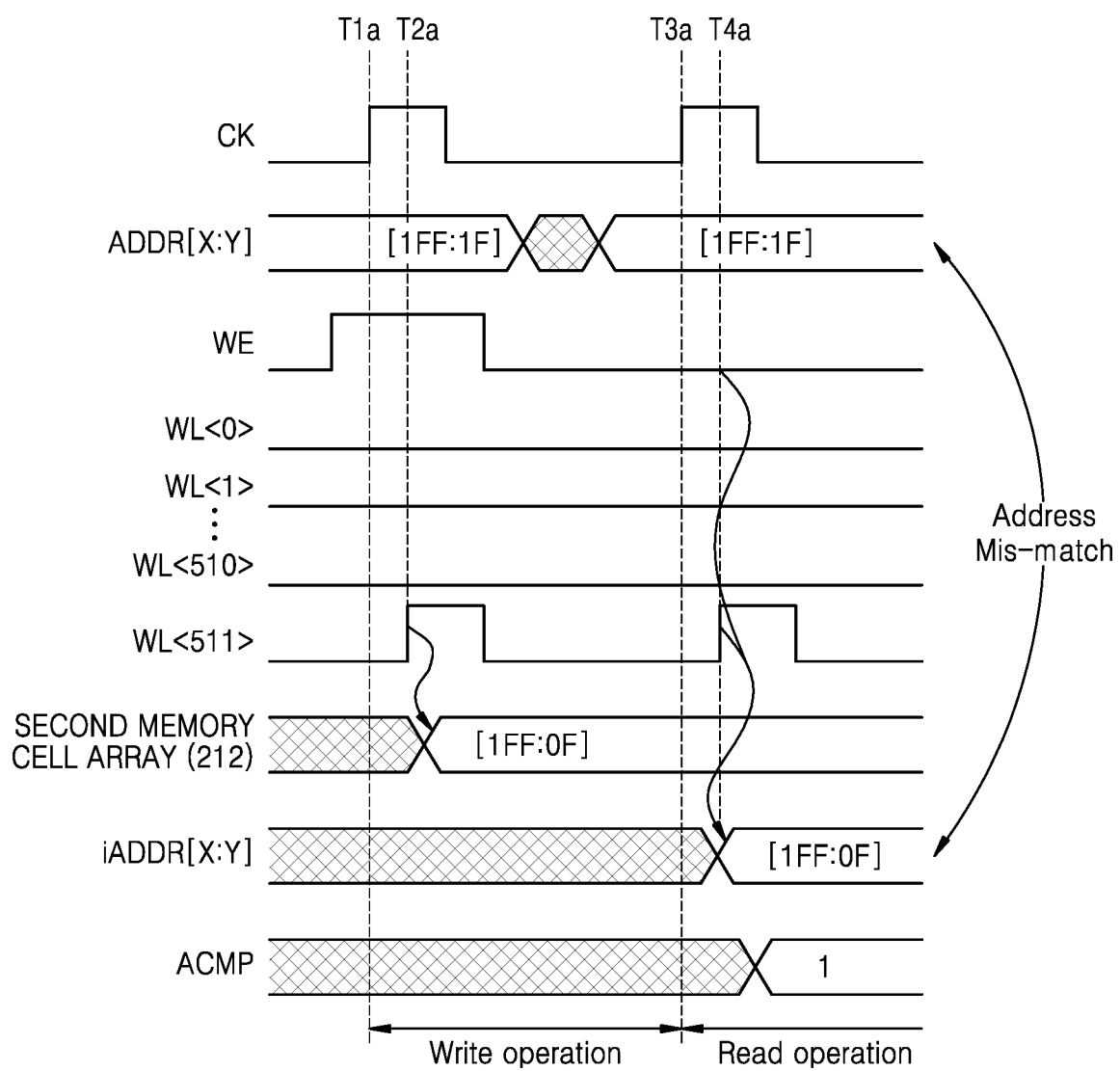
Figure 7:
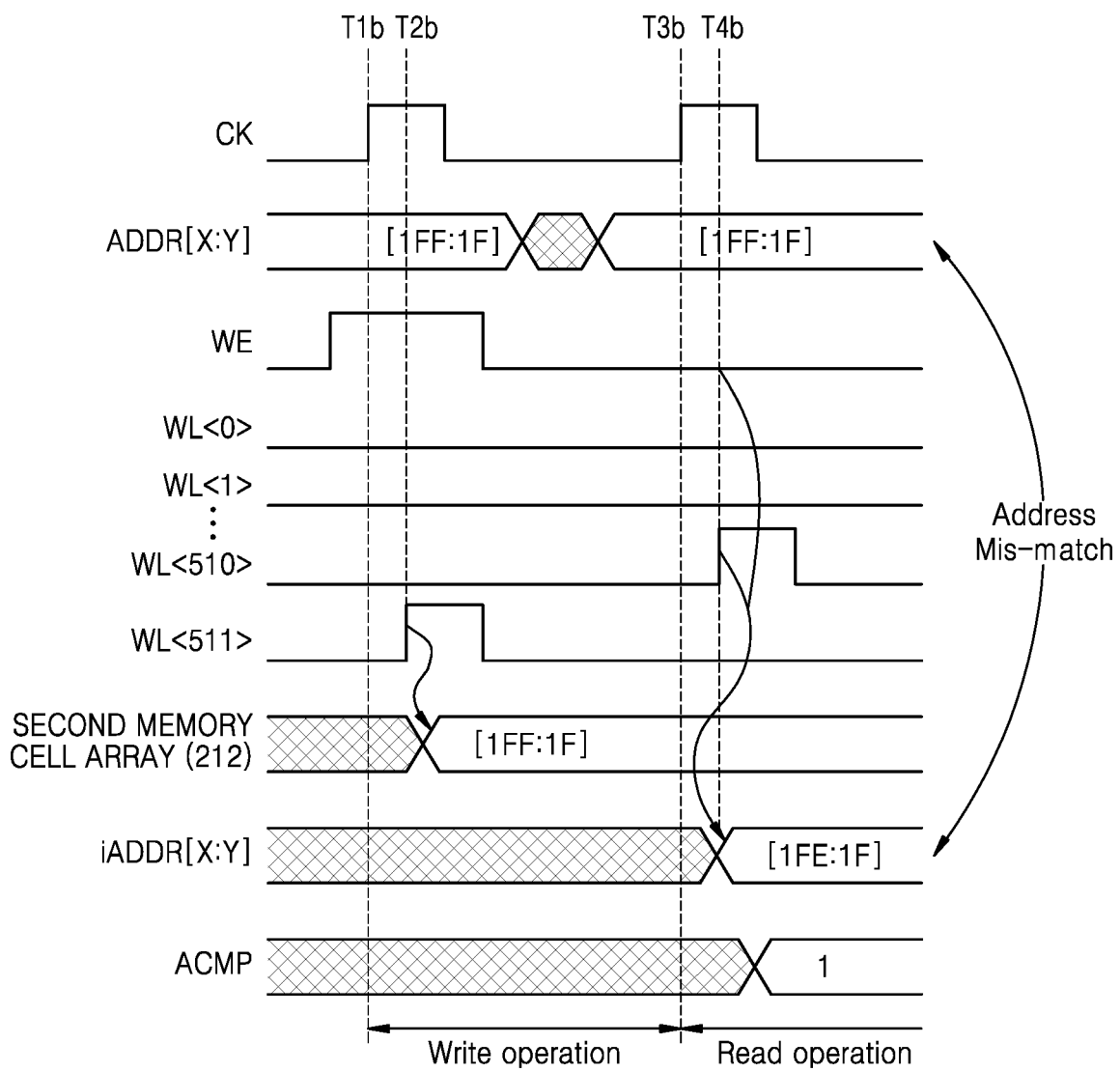

FIGS. 5 to 7 are timing diagrams for describing operations of the memory device 114 of FIG. 2 according to example embodiments. FIG. 5 shows an operation of outputting an address comparison signal ACMP representing address match according to an operation of the memory device 114, and FIGS. 6 and 7 show an operation of outputting an address comparison signal ACMP representing address mismatch. FIGS. 5 to 7 are timing diagrams when the memory device 114 operates based on a clock signal CK, in connection with FIGS. 2 to 4. For example, the timing diagrams described in the disclosure are not necessarily shown at a certain ratio.

Referring to FIG. 5, at a time point T1, a clock signal CK may be received by the memory device 114. The clock signal CK may be provided from the processor 112 to synchronize a time of writing/reading of data to/from the memory device 114 while the processor 112 (see FIG. 1) executes a certain task or process.

For example, at the time point T1, a rising edge of the clock signal CK may be received, and before the rising edge of the clock signal CK is received, an address signal ADDR[X:Y] designating a write operation may be received from the processor 112 and a write enable signal WE may be activated to a logic high level. It is assumed that, in the address signal ADDR[X:Y], 9 bits of a row address signal ADDR[X] are configured with a hexa code 0x1FF of which all bits are "1" and 5 bits of a column address signal ADDR[Y] are configured with a hexa code 0x1F of which all bits are "1".

At a time point T2, a word line WL<511> of 512 word lines WL<511:0> may be activated to a logic high level in response to 0x1FF code bits of the row address signal ADDR[X].

At the time point T2, memory cells MC of the second memory cell array 212, connected to the activated word line WL<511>, may perform a write operation in response to the activated write enable signal WE. In the memory cells MC of the second memory cell array 212 connected to the activated word line WL<511>, a copy of the address signal ADDR[X:Y] configured with the row address signal ADDR[X] of 0x1FF code bits and the column address signal ADDR[Y] of 0x1F code bits may be written.

Moreover, at the time point T2, in the first memory cell array 211, a memory cell MC connected to a bit line BLF corresponding to the column address signal ADDR[Y] of 0x1F code bits among memory cells MC of each of the memory blocks BLK0 to BLK31 connected to the activated word line WL<511> may be selected. A memory cell MC may be selected from each of the memory blocks BLK0 to BLK31, and input data DIN[31:0] may be respectively written to the selected 32 memory cells MC. The writing operation of the memory device 114 may be performed during a time period from the time point T1 to a time point T3.

At the time point T3, a rising edge of the clock signal CK may be received by the memory device 114. Before the rising edge of the clock signal CK is received, an address signal ADDR[X:Y] designating a read operation may be received. It is assumed that the address signal ADDR[X:Y] is configured with the row address signal ADDR[X] of 0x1FF code bits and the column address signal ADDR[Y] of code bits 0x1F, designated in the write operation previously performed.

At a time point T4, a word line WL<511> of the 512 word lines WL<511:0> may be activated to a logic high level in response to the 0x1FF code bits of the row address signal ADDR[X]. Memory cells MC of the second memory cell array 212, connected to the activated word line WL<511>, may perform a read operation in response to a deactivated write enable signal WE. Copies of the row address signal ADDR[X] of 0x1FF code bits and the column address signal ADDR[Y] of 0x1F code bits, stored in the memory cells MC of the second memory cell array 212, may be read and output as an internal address signal iADDR[X:Y]. The internal address signal iADDR[X:Y] may be configured with an internal row address signal iADDR[X] of 0x1FF code bits and an internal column address signal iADDR[Y] of 0x1F code bits and provided to the comparator 251.

The comparator 251 may latch the address signal ADDR[X:Y] designating the read operation, and compare the latched address signal ADDR[X:Y] to the internal address signal iADDR[X:Y] to output an address comparison signal ACMP. The comparator 251 may compare the row address signal ADDR[X] of 0x1FF code bits to the internal address signal iADDR[X] of 0x1FF code bits, and compare the column address signal ADDR[Y] of 0x1F code bits to the internal address signal iADDR[Y] of 0x1F code bits. The comparator 251 may determine address match as a result of the comparing and output an address comparison signal of a logic "0" level representing address match.

Referring to FIG. 6, at a time point T1a, a clock signal CK may be received by the memory device 114. Before a rising edge of the clock signal CK is received, an address signal ADDR[X:Y] designating a write operation may be received from the processor 112, and a write enable signal WE may be activated to a logic high level. For example, an address signal ADDR[X:Y] configured with a row address signal ADDR[X] of 0x1FF code bits and a column address signal of 0x1F code bits may be received.

At a time point T2a, a word line WL<511> corresponding to the 0x1FF code bits of the row address signal ADDR[X] among the 512 word lines WL<511:0> may be activated to a logic high level in response to the 0x1FF code bits of the row address signal ADDR[X]. In the memory cells MC of the second memory cell array 212, connected to the activated WL<511>, copies of the row address signal ADDR[X] of 0x1FF code bits and the column address signal ADDR[Y] of 0x1F code bits may be expected to be written.

However, a memory error may be generated in the memory cells MC of the second memory cell array 212, connected to the word line WL<511>. The memory error may be a soft-bit memory error and/or a fixed memory error. The soft-bit memory error may be generated when a value of a data bit latched at the nodes A and B of a memory cell MC (see FIG. 3) is temporarily flipped (for example, from "1" to "0" or vice versa) by an a-ray emitted from a radioactive material included in an integrated circuit IC of the memory device 114. The fixed memory error may be caused by a fault (for example, line open/short/bridge and/or presence of a defective transistor) of the IC of the memory device 114.

For example, the memory error may be generated in the memory cells MC of the second memory cell array 212, connected to the word line WL<511>. Accordingly, in the memory cells MC of the second memory cell array 212, connected to the activated WL<511>, the row address signal ADDR[X] may be stored as 0x1FF code bits, whereas the column address signal ADDR[Y] may be stored as, for example, 0x0F code bits, instead of 0x1F code bits, due to the memory error.

At a time point T3a, a rising edge of the clock signal CK may be received by the memory device 114. Before the rising edge of the clock signal CK is received, an address signal ADDR[X:Y] designating a read operation may be received. The address signal ADDR[X:Y] designating the read operation may be configured with the row address signal ADDR[X] of 0x1FF code bits and the column address signal ADDR[Y] of 0x1F code bits, designated in the write operation performed during the previous time period from the time point Ta1 to the time point Ta2.

At a time point T4a, the memory cells MC of the second memory cell array 212, connected to the activated word line WL<511> of the 512 word lines WL<511:0>, may perform a read operation in response to a deactivated write enable signal WE. The row address signal ADDR[X] of 0x1FF code bits and the column address signal ADDR[Y] of 0x0F code bits stored in the memory cells MC of the second memory cell array 212, the memory cells MC connected to the activated word line WL<511> may be read and output as an internal address signal iADDR[X:Y]. The internal address signal iADDR[X:Y] may be configured with an internal row address signal ADDR[X:Y] of 0x1FF and an internal column address signal iADDR[Y] of 0x0F code bits and provided to the comparator 251.

The comparator 251 may compare the row address signal ADDR[X] of 0x1FF code bits to the internal row address signal iADDR[X] of 1x1FF, and compare the column address signal ADDR[Y] of 0x1F code bits to the internal column address signal iADDR[Y] of 0x0F code bits. The comparator 251 may determine address mismatch as a result of the comparing and output an address comparison signal ACMP of a logic "1" level representing address mismatch.

Referring to FIG. 7, at a time point T1b, a clock signal CK may be received by the memory device 114. Before a rising edge of the clock signal CK is received, an address signal ADDR[X:Y] designating a write operation may be received from the processor 112, and a write enable signal WE may be activated to a logic high level. For example, an address signal ADDR[X:Y] configured with a row address signal ADDR[X] of 0x1FF code bits and a column address signal of 0x1F code bits may be received.

At a time point T2b, a word line WL<511> of the 512 word lines WL<511:0> may be activated to a logic high level in response to the 0x1FF code bits of the row address signal ADDR[X]. In memory cells MC of the second memory cell array 212, connected to the activated word line WL<511>, copies of the row address signal ADDR[X] of 0x1FF code bits and the column address signal ADDR[Y] of 0x1F code bits may be written.

At a time point T3b, a rising edge of the clock signal CK may be received by the memory device 114. Before the rising edge of the clock signal CK is received, an address signal ADDR[X:Y] designating a read operation may be received. The address signal ADDR[X:Y] designating the read operation may be configured with the row address signal ADDR[X] of 0x1FF code bits and the column address signal ADDR[Y] of 0x1F code bits, designated in the write operation performed during the previous time period from the time point T1b to the time point T3b.

At a time point T4b, the word line WL<511> of the 512 word lines WL<511:0> may be expected to be activated in response to the 0x1FF code bits of the row address signal ADDR[X]. However, a word line WL<510>, instead of the word line WL<511>, may be activated due to a memory error generated in the memory device 114. Memory cells MC of the second memory cell array 212, connected to the activated word line WL<510>, may perform a read operation in response to a deactivated write enable signal WE. In the memory cells MC of the second memory cell array 212, connected to the word line WL<510>, a row address signal ADDR[X] of 0x1FE code bits and a column address signal ADDR[Y] of 0x1F code bits may have been stored.

An internal address signal iADDR[X:Y] read from the memory cells MC of the second memory cell array 212, the memory cells MC connected to the activated word line WL<510>, may be configured with an internal row address signal iADDR[X] of 0x1FE code bits and an internal column address signal iADDR[Y] of 0x1F code bits, and provided to the comparator 251.

The comparator 251 may compare the row address signal ADDR[X] of 0x1FF code bits to the internal row address signal iADDR[X] of 0x1FE code bits, and compare the column address signal ADDR[Y] of 0x1F code bits to the internal column address signal iADDR[Y] of 0x1F code bits. The comparator 251 may determine address mismatch as a result of the comparing and output an address comparison signal ACMP of a logic "1" level representing address mismatch.

Figure 8A:
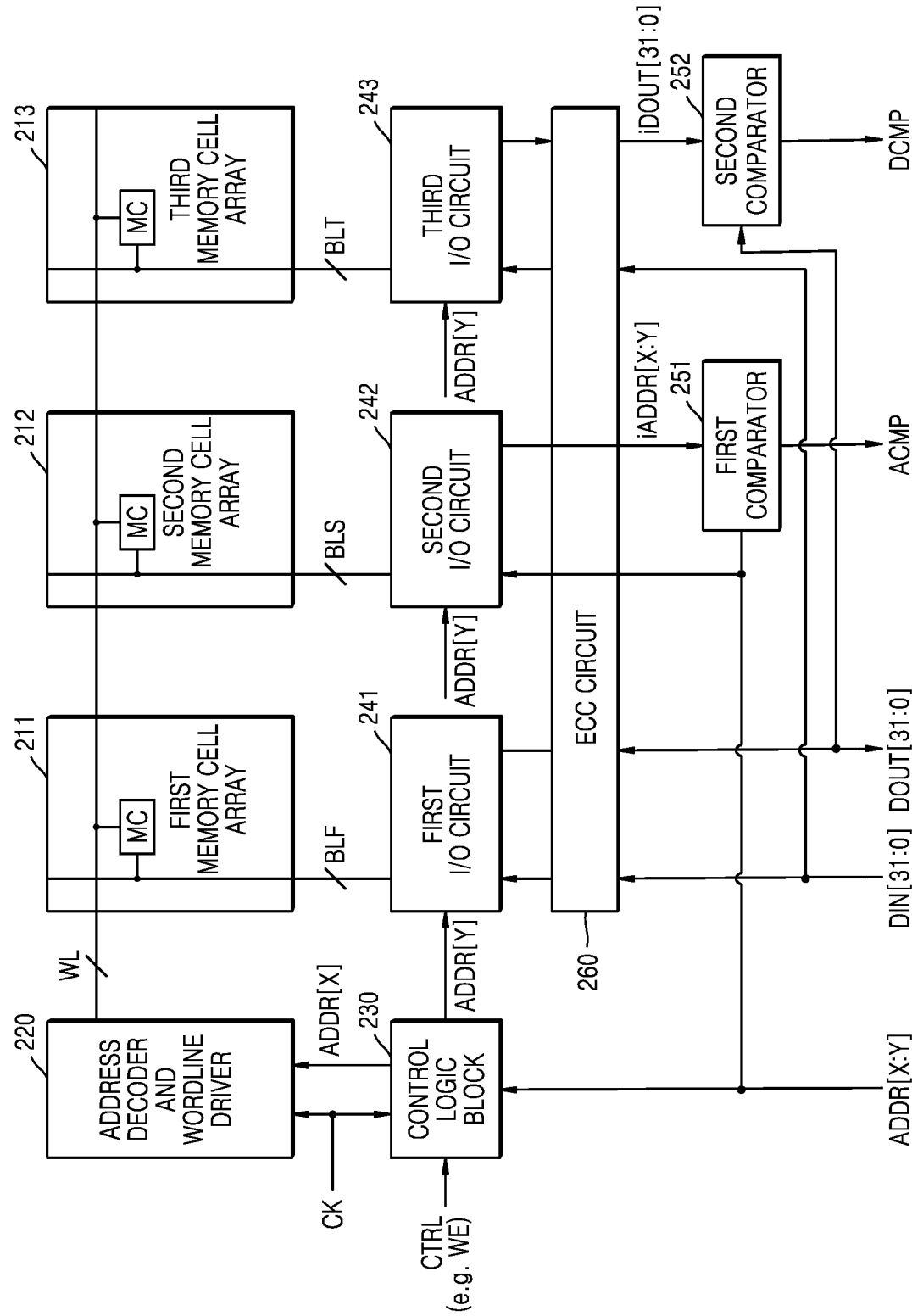
FIGS. 8A, 8B, and 9 are diagrams for describing memory devices according to example embodiments of the disclosure.
Figure 8B:
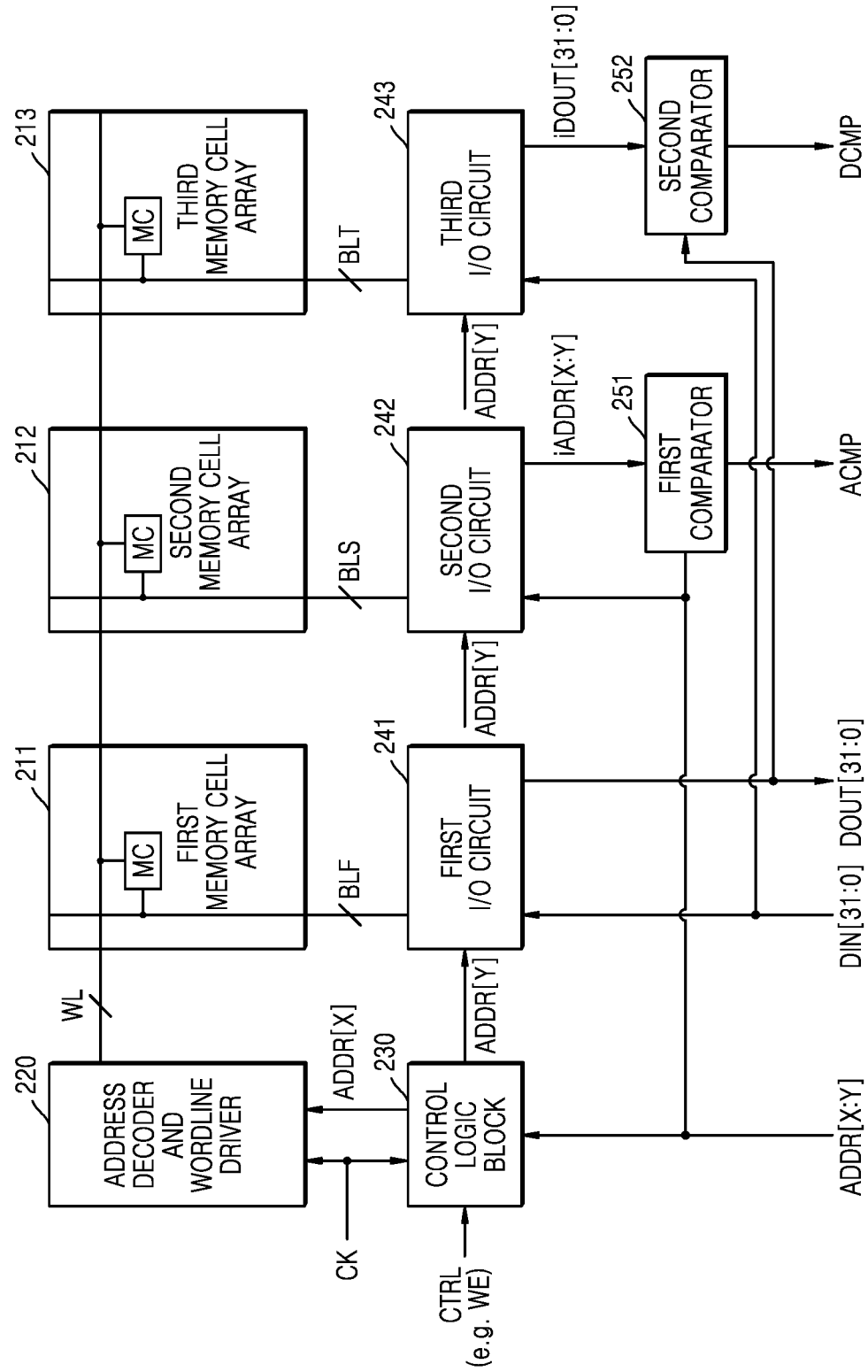
Figure 9:
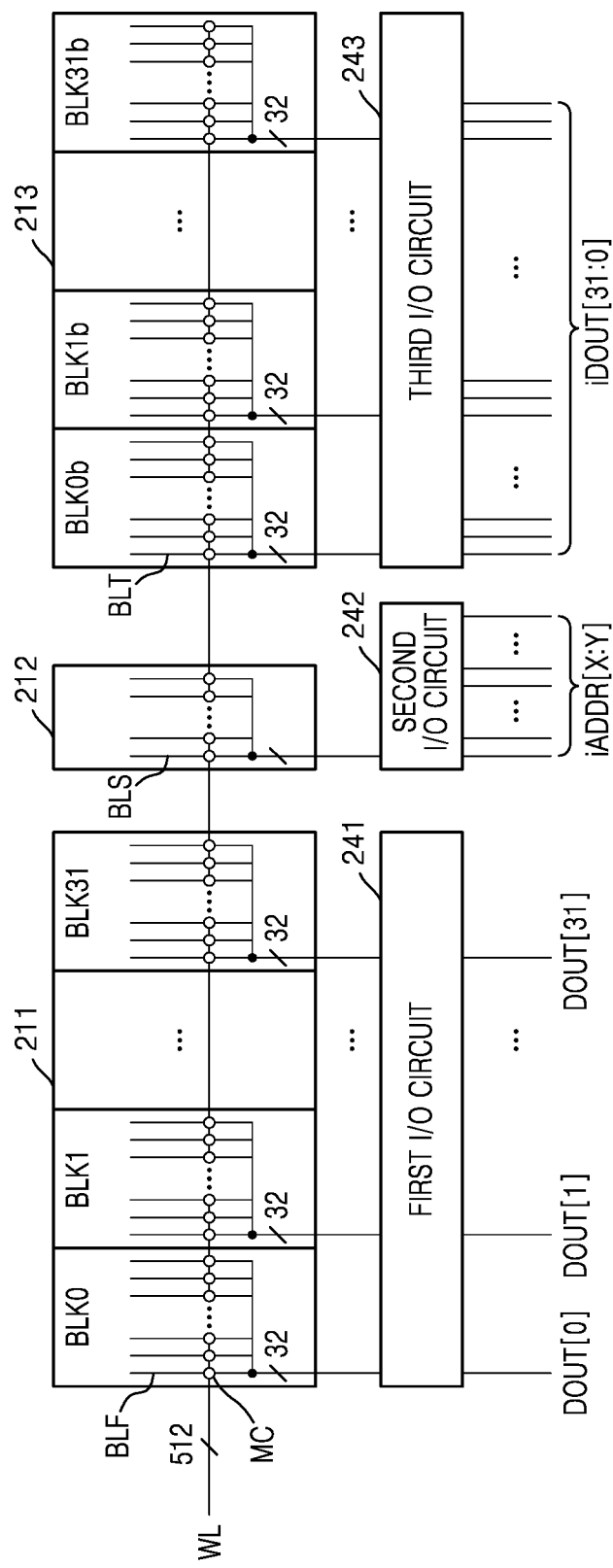

FIGS. 8A, 8B, and 9 are diagrams for describing memory devices according to example embodiments of the disclosure. FIGS. 8A and 8B are block diagrams of memory devices 114a and 114b, and FIG. 9 shows portions of structures of first to third memory cell arrays 211, 212, and 213 of FIGS. 8A and 8B.

Referring to FIGS. 8A and 8B, the memory devices 114a and 114b may include the same components as those included in the memory device 114 described above with reference to FIG. 2. For example, first and second memory cell arrays 211 and 212 of the memory devices 114a and 114b may be the same as or similar to the first and second memory cell arrays 211 and 212 of the memory device 114 of FIG. 2, first and second I/O circuits 241 and 242 of the memory devices 114a and 114b may be the same as or similar to the first and second I/O circuits 241 and 242 of the memory device 114 of FIG. 2, and a first comparator 251 may be the same as or similar to the comparator 251 of FIG. 2. In example embodiments, each of the memory devices 114a and 114b may further include the third memory cell array 213, a third input/output circuit 243, a second comparator 252, and an error correction code (ECC) circuit 260. Hereinafter, the same description as the above description about the memory devices 114a and 114b with reference to FIG. 2 will be omitted.

Referring to FIG. 8A, the memory device 114a may include an ECC circuit 260 for guaranteeing data integrity. The ECC circuit 260 may be connected to the first memory cell array 211. The input data DIN[31:0] to be stored in the first memory cell array 211 may have a soft error or a hard data error. When one or more data bits of the input data DIN[31:0] are flipped while being stored/read in/from the first memory cell array 211, data values of the data bits may change. Also, a damaged memory cell in the first memory cell array 211 may prevent one or more data bits from being correctly stored and read. Accordingly, data read from the first memory cell array 211 may be considered to include such a data error.

To mitigate such a data error, the memory device 114a may include the ECC circuit 260 to generate a parity including one or more parity bits for the input data DIN[31:0], generate the parity by encoding the original input data DIN[31:0], and store a result of the encoding in the first memory cell array 211. The result of the encoding may include a code word having the input data DIN[31:0] and the parity. The first memory cell array 211 may store the code word. The first memory cell array 211 may further include a plurality of memory cells to store the parity. Data that is output through a data access operation (i.e., a read operation)

of the first memory cell array 211 may be the code word resulting from adding the parity to the original input data DIN[31:0], and the code word may be provided to the ECC circuit 260. The ECC circuit 260 may decode the code word and correct data error included in the data read from the first memory cell array 211 by using the parity and output output data DOUT[31:0]. The output data DOUT[31:0] output from the ECC circuit 260 may be provided to the second comparator 252 to be compared to the internal data iDOUT [31:0] read from the third memory cell array 213.

In FIG. 8A, the third memory cell array 213 may store input data DIN[31:0] of the code word output from the ECC circuit 260. The input data DIN[31:0] of the code word output from the ECC circuit 260 may be written in memory cells MC of the first memory cell array 211, the memory cells MC corresponding to an address signal ADDR[X:Y] designating a write operation. The third memory cell array 213 may be adjacent to the second memory cell array 212 in a column direction of the second memory cell array 212. Each memory cell row of the third memory cell array 213 may be connected to a word line WL to which the corresponding memory cell rows of the first and second memory cell arrays 211 and 212 are connected. The word line WL may extend to all the first to third memory cell arrays 211, 212, and 213, and may be connected to the corresponding memory cell rows of the first to third memory cell arrays 211, 212, and 213. Bit lines BLT may be provided to individual memory cell columns of the third memory cell array 213, and each bit line BLT may be implemented as a pair of bit lines including a bit line BL and a complementary bit line/BL.

The third memory cell array 213 may include, as shown in FIG. 9, may include 32 memory blocks BLK0b to BLK31b. The third memory cell array 213 may include a plurality of memory cells MC (see FIG. 3) at corresponding intersections of 32×32 bit lines (e.g., 32 blocks and 32 bit lines BLT in each block) and 512 word lines WL extending from the word lines WL of the first and second memory cell arrays 211 and 212. Input data DIN[31:0] of 32 bits may be provided to the third memory cell array 213 through the 32 bit lines BLT, and internal data iDOUT[31:0] of 32 bits may be output from the third memory cell array 213.

In a write operation, the third input/output circuit 243 may receive the code word resulting from adding the parity to the original input data DIN[31:0] from the ECC circuit 260 according to a control of the control logic block 230. By the third input/output circuit 243, the code word of the input data DIN[31:0] may be written to memory cells MC of the third memory cell array 213, the memory cells MC connected to a word line WL activated in correspondence to a row address signal ADDR[X], through the bit lines BLT, which correspond to the column address signal ADDR[Y]. For example, the memory cells MC of the third memory cell array 213, corresponding to the row address signal ADDR[X:Y] may store the code word of the input data DIN[31:0] output from the ECC circuit 260, the memory cells MC corresponding to the row address signal ADDR[X] and a column address signal ADDR[Y].

In a read operation, an address signal ADDR[X:Y] designating a read operation may be received by the memory device 114a. In the third memory cell array 213, a word line WL corresponding to a row address signal ADDR[X] may be activated, data of memory cells MC connected to the activated word line WL and selected bit lines BLT corresponding to the column address signal ADDR[Y] may be sensed, and the sensed data may be provided to the ECC circuit 260. The ECC circuit 260 may decode the code word and correct data error included in the data read from the third memory cell array 213. The internal data iDOUT[31:0] output from the ECC circuit 260 may be provided to the second comparator 252.

The internal data iDOUT[31:0] read from the third memory cell array 213 through the ECC circuit 260 may be provided to the second comparator 252. The second comparator 252 may determine whether the output data DOUT [31:0] read from the first memory cell array 211 through the ECC circuit 260, corresponding to the address signal ADDR [X:Y] designating the read operation, matches with the internal data iDOUT[31:0] read from the third memory cell array 213 through the ECC circuit 260. The second comparator 252 may compare each bit of the output data DOUT[31:0] of 32 bits to the corresponding one of the internal data iDOUT[31:0] of 32 bits. The second comparator 252 may output a data comparison signal DCMP representing data match or data mismatch as a result of the comparing, and provide the data comparison signal DCMP to the processor 112. The data comparison signal DCMP may provide fault detection functionality for a data error.

Referring to FIG. 8B, the same description as the above description about the memory device 114a with reference to FIG. 8A will be omitted. The first memory cell array 211 may store original input data DIN[31:0] received from the processor 112 instead of the cord word received from the ECC circuit 260 and the third memory cell array 213 may store original input data DIN[31:0] received from the processor 112 instead of the code word received from the ECC circuit 260 as shown FIG. 8A.

In a write operation, the third input/output circuit 243 may receive and copy the original input data DIN[31:0] according to a control of the control logic block 230. By the third input/output circuit 243, a copy of the original input data DIN[31:0] may be written to memory cells MC of the third memory cell array 213, the memory cells MC connected to a word line WL activated in correspondence to a row address signal ADDR[X], through the bit lines BLT, which correspond to the column address signal ADDR[Y]. For example, the memory cells MC of the third memory cell array 213, corresponding to the row address signal ADDR[X:Y] may store the copy of the original input data DIN[31:0] of 32 bits to be written in the memory cells MC of the first memory cell array 211 through the ECC circuit 260, the memory cells MC corresponding to the row address signal ADDR[X] and a column address signal ADDR[Y].

In a read operation, an address signal ADDR[X:Y] designating a read operation may be received by the memory device 114b. In the third memory cell array 213, a word line WL corresponding to a row address signal ADDR[X] may be activated, data of memory cells MC connected to the activated word line WL and selected bit lines BLT corresponding to the column address signal ADDR[Y] may be sensed, and the sensed data may be output as internal data iDOUT[31:0] through the third input/output circuit 243. The internal data iDOUT[31:0] may be the copy of the original input data DIN[31:0] of 32 bits to be written in the memory cells MC of the first memory cell array 211 through the ECC circuit 260, the memory cells MC corresponding to the address signal ADDR[X:Y].

Figure 10:
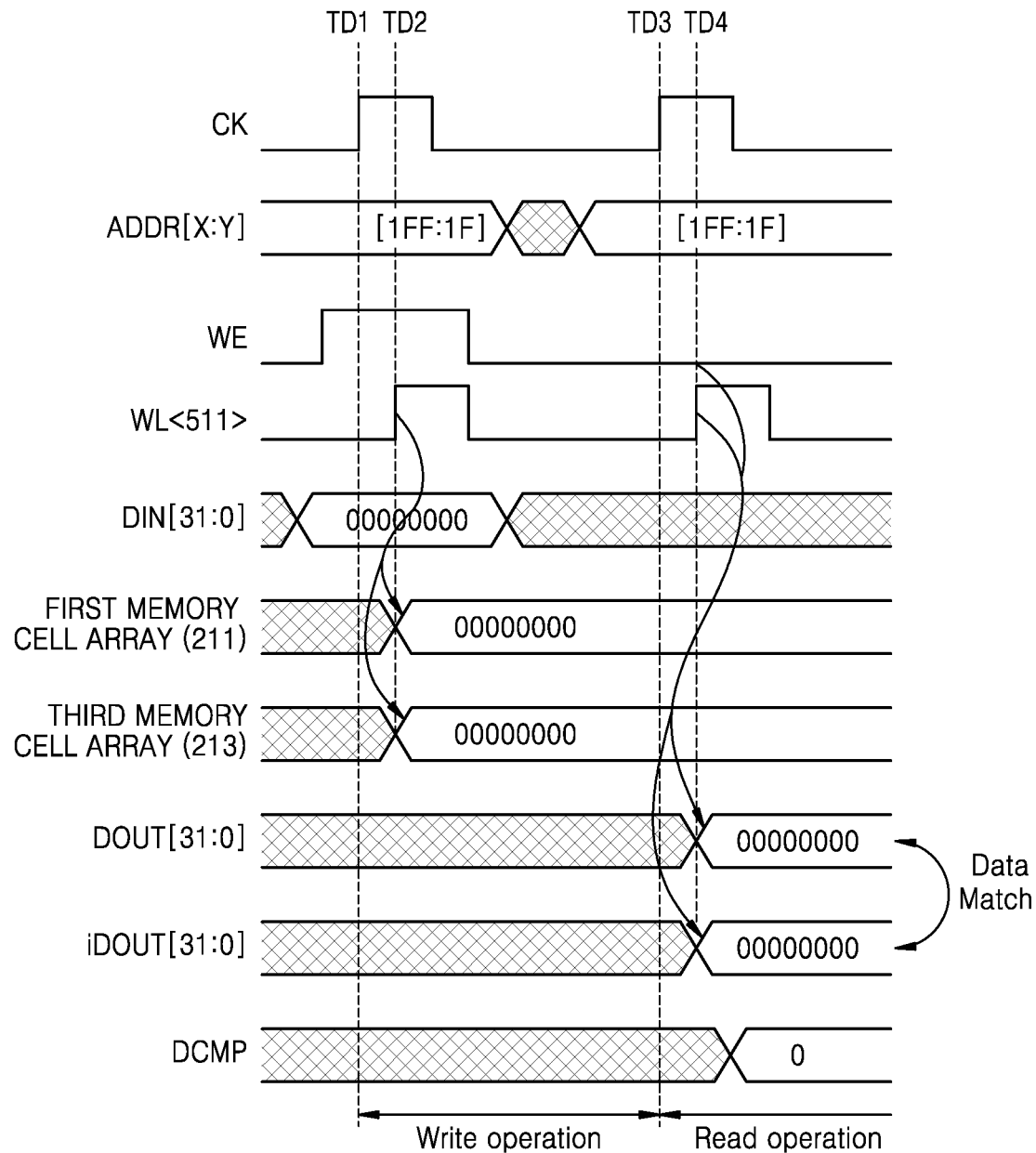
FIGS. 10 and 11 are timing diagrams for describing operations of the memory device of FIG. 8A according to example embodiments.
Figure 11:
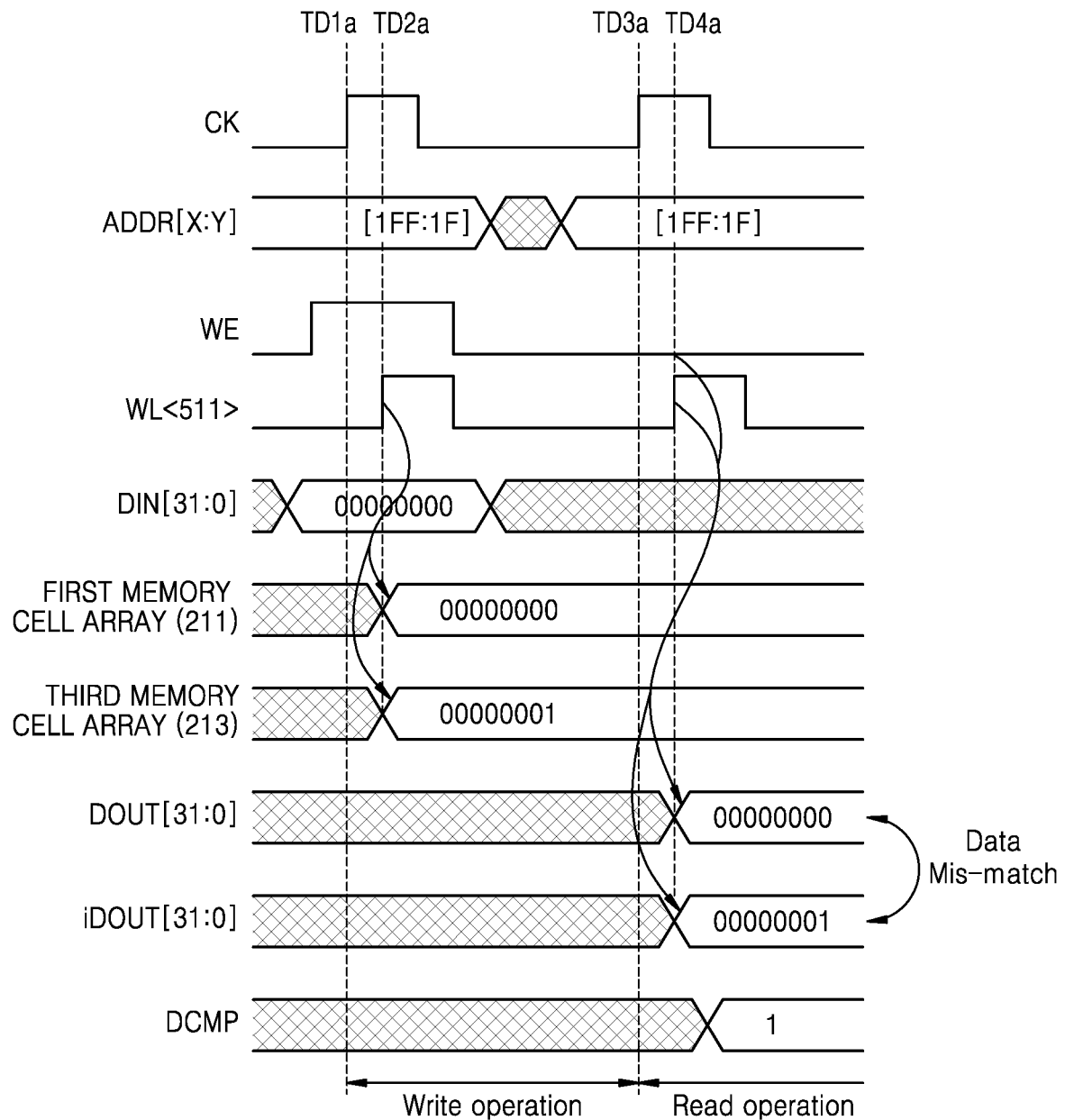

FIGS. 10 and 11 are timing diagrams for describing operations of the memory device 114a of FIG. 8A according to example embodiments. FIG. 10 shows an operation of outputting a data comparison signal DCMP representing data match according to an operation of the memory device 114a, and FIG. 11 shows an operation of outputting a data comparison signal DCMP representing data mismatch.

Referring to FIGS. 8A, 9, and 10, at a time point TD1, a rising edge of a clock signal CK may be received by the memory device 114a, and a write enable signal WE of a logic high level may be received. Before the rising edge of the clock signal CK is received, an address signal ADDR [X:Y] designating a write operation and input data DIN[31:0] may be received from the processor 112. It is assumed that the address signal ADDR[X:Y] is configured with a row address signal ADDR[X] of 0x1FF code bits and a column address signal ADDR[Y] of 0x1F code bits, and the input data DIN[31:0] is configured with a hexa code 0x00000000 of 32 bits of which all bits are "0".

At a time point TD2, a word line WL<511> of 512 word lines WL<511:0> may be activated to a logic high level in response to the 0x1FF code bits of the row address signal ADDR[X].

At the time point TD2, in the first memory cell array 211, a memory cell MC connected to a bit line BLF corresponding to the column address signal ADDR[Y] of 0x1F code bits among memory cells MC of each of memory blocks BLK0 to BLK31 connected to the activated word line WL<511> may be selected. A memory cell MC may be selected from each of the memory blocks BLK0 to BLK31, and input data DIN[31:0] of 0x00000000 code bits may be respectively written to the selected 32 memory cells MC. A copy of the input data DIN[31:0] of 0x00000000 code bits may be written to memory cells MC of the third memory cell array 213, the memory cells MC corresponding to the row address signal ADDR[X].

Moreover, at the time point TD2, copies of the row address signal ADDR[X] of 0x1FF code bits and the column address signal ADDR[Y] of 0x1F code bits may be written to memory cells MC of the second memory cell array 212. The memory cells MC of the second memory cell array 212 corresponds to the row address signal ADDR[X].

At a time point TD3, a rising edge of the clock signal CK may be received by the memory device 114a. Before the rising edge of the clock signal CK is received, an address signal ADDR[X:Y] designating a read operation may be received. It is assumed that the address signal ADDR[X:Y] is configured with a row address signal ADDR[X] of 0x1FF code bits and a column address signal ADDR[Y] of 0x1F code bits, like an address signal ADDR[X:Y] designated in a write operation previously performed.

At a time point TD4, a word line WL<511> of the 512 word lines WL<511:0> may be activated to a logic high level in response to the 0x1FF code bits of the row address signal ADDR[X]. Memory cells MC of the first to third memory cell arrays 211, 212, and 213, connected to the activated word line WL<511> may perform a read operation in response to a deactivated write enable signal WE. The 0x00000000 code bits stored in the memory cells MC of the first memory cell array 211 may be output as output data DOUT[31:0]. An internal address signal iADDR[X:Y] configured with an internal row address signal iADDR[X] of 0x1FF code bits and an internal column address signal iADDR[Y] of 0x1F code bits, stored in the memory cells MC of the second memory cell array 212, may be output. The 0x00000000 code bits stored in the memory cells MC of the third memory cell array 213 may be output as internal data iDOUT[31:0].

The first comparator 251 may compare the address signal ADDR[X:Y] designating the read operation to the internal address signal iADDR[X:Y], and output an address comparison signal ACMP. The second comparator 252 may compare the output data DOUT[31:0] of 0x00000000 code bits to the internal data iDOUT[31:0] of 0x00000000 code bits. The second comparator 252 may determine data match as a result of the comparing, and output a data comparison signal DCMP of a logic "0" level representing data match.

Referring to FIGS. 8A, 9, and 11, at a time point TD1a, a clock signal CK may be received by the memory device 114a. Before a rising edge of the clock signal CK is received, an address signal ADDR[X:Y] designating a write operation may be received from the processor 112, and a write enable signal WE of a logic high level may be received. For example, an address signal ADDR[X:Y] configured with a row address signal ADDR[X] of 0x1FF code bits and a column address signal ADDR[Y] of 0x1F code bits, and input data DIN[31:0] of 0x0000000 code bits may be received.

At a time point TD2a, a word line WL<511> corresponding to the 0x1FF code bits of the row address signal ADDR[X] among the 512 word lines WL<511:0> may be activated to a logic high level. In the first memory cell array 211, a memory cell MC connected to a bit line BLF corresponding to the column address signal ADDR[Y] of 0x1F code bits among the memory cells MC of each of memory blocks BLK0 to BLK31 connected to the activated word line WL<511> may be selected, and the input data DIN[31:0] of 0x00000000 code bits may be written to the selected memory cells MC. In memory cells MC of the second memory cell array 212, connected to the activated word line WL<511>, copies of the row address signal ADDR[X] of 0x1FF code bits and the column address signal ADDR[Y] of 0x1F code bits may be written.

For example, a memory error may be generated in the memory cells MC of the third memory cell array 213 connected to the word line WL<511>. Accordingly, in the memory cells MC of the third memory cell array 213, connected to the activated word line WL<511>, for example, 0x00000001 code bits, instead of the 0x00000000 code bits of the input data DIN[31:0], may be written.

At a time point TD3a, a rising edge of a clock signal CK may be received by the memory device 114a. Before the rising edge of the clock signal CK is received, an address signal ADDR[X:Y] designating a read operation may be received. The address signal ADDR[X:Y] designating the read operation may be configured with the row address signal ADDR[X] of 0x1FF code bits and the column address signal ADDR[Y] of 0x1F code bits, designated in the write operation performed during the previous time period from the time point TD1a to the time point TD3a.

At a time point TD4a, the word line WL<511> of the 512 word lines WL<511:0> may be activated to a logic high level in response to the 0x1FF code bits of the row address signal ADDR[X]. Memory cells MC of the first to third memory cell arrays 211, 212, and 213, connected to the activated word line WL<511>, may perform a read operation in response to a deactivated write enable signal WE. The 0x00000000 code bits stored in the memory cells MC of the first memory cell array 211 may be output as output data DOUT[31:0], an internal address signal iADDR[X:Y] may be output from the memory cells MC of the second memory cell array 212, and the 0x00000001 code bits stored in the memory cells MC of the third memory cell array 213 may be output as internal data iDOUT[31:0].

The first comparator 251 may compare the address signal ADDR[X:Y] designating the read operation to the internal address signal iADDR[X:Y], and output an address comparison signal ACMP. The second comparator 252 may compare the output data DOUT[31:0] of 0x00000000 code bits to the internal data iDOUT[31:0] of 0x00000001 code bits. The second comparator 252 may determine data mismatch as a result of the comparing, and output a data comparison signal DCMP of a logic "1" level representing data mismatch.

While the inventive concept has been particularly shown and described with reference to embodiments thereof, it will be understood that various changes in form and details may be made therein without departing from the spirit and scope of the following claims.

What is claimed is:

1. A memory device comprising:
a first memory cell array including a plurality of first memory cells at corresponding intersections of a plurality of first bit lines and word lines, each word line connected to a corresponding one of a plurality of memory cell rows;
a second memory cell array positioned adjacent to the first memory cell array, and including a plurality of second memory cells at corresponding intersections of a plurality of second bit lines and the word lines extending from the first memory cell array;
a control logic block configured to:
control a write operation and a read operation of the memory device,
receive a row address for addressing the word lines and a column address for addressing the plurality of first bit lines,
store, when the write operation is performed, bit values of the row address and the column address in the plurality of second memory cells in correspondence to the row address and the column address, and
output, when the read operation is performed, the bit values of the row address and the column address stored in the plurality of second memory cells in correspondence to the row address and the column address, as an internal row address and an internal column address; and
a first comparator configured to:
receive the row address and the column address designating the read operation,
compare the row address to the internal row address, and compare the column address to the internal column address, and
output an address comparison signal as a result of the comparison.

2. The memory device of claim 1, wherein the address comparison signal indicates fault detection functionality for data error of the memory device.

3. The memory device of claim 1, wherein the plurality of first and second memory cells are static random access memory (SRAM) cells.

4. The memory device of claim 1, wherein a selected number of bit lines of the plurality of second bit lines and a selected number of memory cells of the plurality of second memory cells connected to an activated word line in correspondence to the row address, are equal to a sum of the number of bits of the row address and the number of bits of the column address.

5. The memory device of claim 1, wherein the control logic block is further configured to:
store, when the write operation is performed, input data in the plurality of first memory cells in correspondence to the row address and the column address, and
output, when the read operation is performed, the input data stored in the plurality of first memory cells in correspondence to the row address and the column address, as output data.

6. The memory device of claim 5, further comprising:
a first input/output circuit configured to select a first bit line of the plurality of first bit lines in response to the column address, and to store the input data in a first set of memory cells of the plurality of first memory cells, the first set of memory cells connected to an activated word line of the word lines responsive to the row address and connected to the selected first bit line.

7. The memory device of claim 6, further comprising:
a second input/output circuit configured to select a second bit line of the plurality of second bit lines in response to the column address, and to store bit values of the row address and the column address in a second set of memory cells of the plurality of second memory cells, the second set of memory cells connected to the activated word line and connected to the selected second bit line.

8. The memory device of claim 1, wherein the number of memory cells of the plurality of second memory cells connected to a word line is equal to the number of $2^X$ (X=the number of bits of the column address) multiplied by a sum of bits of the number of bits of the row address and the number of bits of the column address.

9. The memory device of claim 1, wherein the memory device includes one of static random access memory (SRAM), dynamic random access memory (DRAM), flash memory, resistive RAM (RRAM), magnetic RAM (MRAM), and phase change RAM (PRAM).

10. A method of operating a memory device for providing fault detection of the memory device, the memory device including first and second memory cell arrays, the method comprising:
receiving a row address and a column address designating a write operation of the memory device;
storing input data in first memory cells of the first memory cell array in correspondence to the row address and the column address;
storing bit values of the row address and the column address in second memory cells of the second memory cell array in correspondence to the row address and the column address;
receiving the row address and the column address designating a read operation of the memory device;
outputting the bit values of the row address and the column address stored in the second memory cells in correspondence to the row address and the column address, as an internal row address and an internal column address;
comparing the row address to the internal row address and comparing the column address to the internal column address; and
outputting an address comparison signal representing address match or address mismatch as a result of the comparing.

11. The method of claim 10, further comprising:
providing fault detection for an error of the memory device to a control system including the memory device by using the address comparison signal.

12. The method of claim 10, wherein the storing of the input data in the first memory cells, comprises:
activating a word line corresponding to the row address among word lines connected to a plurality of memory cell rows, in each of memory blocks included in the first memory cell array, each memory block corresponding to the number of bits of the input data;

in each of the memory blocks, selecting a first bit line corresponding to the column address from among a plurality of first bit lines connected to the first memory cells; and in each of the memory blocks, storing the input data in a first set of memory cells of the first memory cells, the first set of memory cells connected to the activated word line and the selected first bit line.

13. The memory device of claim 12, wherein the storing of bit values of the row address and the column address in the second memory cells, comprises:

in each of the memory blocks, selecting a second bit line corresponding to the column address from among a plurality of second bit lines connected to the second memory cells;

storing the bit values of the row address and the column address in a second set of memory cells of the second memory cells, the second set of memory cells connected to a word line extending from the activated word line of the first memory cell array and connected to the selected second bit line.

14. A control system for controlling an operation of an electronic system, the control system comprising:

a memory device configured to store input data related to an operation of the electronic system; and a processor connected to and communicating with the memory device and configured to detect a fault for a data error of the memory device, wherein the memory device comprises:

a first memory cell array including first memory cells configured to store the input data;

a second memory cell array including second memory cells configured to store bit values of a row address and a column address for addressing the first memory cells;

a control logic block configured to:

control a write operation and a read operation of the memory device, store, when the write operation is performed, bit values of the row address and the column address in the second memory cells, and output, when the read operation is performed, the bit values of the row address and the column address stored in the second memory cells, as an internal row address and an internal column address; and a first comparator configured to:

receive the row address and the column address designating the read operation, compare the row address to the internal row address, and compare the column address to the internal column address, output an address comparison signal as a result of the comparison, and provide the address comparison signal to the processor, wherein the processor is further configured to detect the fault for the data error of the memory device from the address comparison signal.

15. The control system of claim 14, wherein the control logic block is further configured to output, when the read operation is performed, the input data stored in the first memory cells in correspondence to the row address and the column address, as output data.

16. The control system of claim 14, wherein the first memory cell array includes the first memory cells at corresponding intersections of first bit lines and word lines, each word line connected to a corresponding one of a plurality of memory cell rows, and wherein the second memory cell array is positioned adjacent to the first memory cell array, and includes the second memory cells at corresponding intersections of second bit lines and the word lines extending from the first memory cell array.

17. The control system of claim 16, wherein the first memory cell array includes memory blocks corresponding to the number of bits of the input data, and wherein each of the memory blocks is configured to store the input data in a first memory cell connected to a word line activated in correspondence to the row address and connected to a first bit line selected in correspondence to the column address among the first bit lines.

18. The control system of claim 17, wherein the second memory cell array is configured to store bit values of the row address and the column address in a second set of the second memory cells, the second set of memory cells connected to a word line activated in correspondence to the row address.

19. The control system of claim 14, wherein the first memory cells of the first memory cell array and the second memory cells of the second memory cell array are static random access memory (SRAM) cells.

20. The control system of claim 14, wherein the electronic system is included in an automotive vehicle.

* * * * *